United States Patent [19]
Rigali et al.

[11] Patent Number: 5,766,404
[45] Date of Patent: Jun. 16, 1998

[54] METHODS AND APPARATUS FOR PLASMA TREATMENT OF WORKPIECES

[75] Inventors: Louis A. Rigali, Martinez; David E. Hoffman, Concord; William F. Smith, III, Bay Point, all of Calif.

[73] Assignee: March Instruments, Inc., Concord, Calif.

[21] Appl. No.: 567,797

[22] Filed: Dec. 5, 1995

Related U.S. Application Data

[63] Continuation-in-part of Ser. No. 350,320, Dec. 5, 1994.

[51] Int. Cl.$^6$ ............................................. H05H 1/00
[52] U.S. Cl. ................. 156/345; 118/719; 118/723 E; 118/729; 118/730
[58] Field of Search ........................... 156/345; 118/729, 118/730, 719, 723 E

[56] References Cited

U.S. PATENT DOCUMENTS

| | | | |
|---|---|---|---|
| 4,318,767 | 3/1982 | Hijikata | 156/345 |
| 4,550,242 | 10/1985 | Uehara et al. | 156/345 |
| 4,575,299 | 3/1986 | Layton | 414/222 |
| 4,584,045 | 4/1986 | Richards | 156/345 |
| 4,705,444 | 11/1987 | Tullis et al. | 118/729 X |
| 4,816,116 | 3/1989 | Davis | 156/643 |
| 5,079,031 | 1/1992 | Yamazaki et al. | 118/729 X |
| 5,116,640 | 5/1992 | Mikami et al. | 118/719 X |
| 5,259,942 | 11/1993 | Kempf | 204/298.25 |
| 5,286,296 | 2/1994 | Sato | 118/719 |
| 5,288,684 | 2/1994 | Yamazaki et al. | 118/723 E X |
| 5,292,393 | 3/1994 | Maydan | 156/345 |
| 5,302,077 | 4/1994 | Sato | 414/609 |
| 5,310,410 | 5/1994 | Begin | 29/25.01 |
| 5,314,298 | 5/1994 | Kim | 414/797.9 |
| 5,387,265 | 2/1995 | Kakizaki et al. | 118/730 X |
| 5,515,986 | 5/1996 | Turlot et al. | 156/345 X |

*Primary Examiner*—Thi Dang
*Attorney, Agent, or Firm*—Michael J. Hughes; Mark E. Baze; Rankin A. Milliken

[57] ABSTRACT

Methods and apparatus for plasma treatment of workpieces in which the apparatus includes a reaction chamber having a door through which a magazine loaded with workpieces and an empty magazine can be manually or robotically placed on a shelf in the reaction chamber, and associated apparatus for striking and maintaining a plasma in the reaction chamber, the shelf being provided with stops for maintaining both magazines in alignment so that the workpieces can be pushed out of the loaded magazine, across a gap between the magazines, and into the empty magazine while plasma exists in the gap, and pushing apparatus for pushing workpieces from the loaded magazine, across the gap, and into the empty magazine, and the method of plasma treatment carried out by this apparatus. In one version the pushing apparatus pushes all of the workpieces from magazine to magazine at once. In another version, a subplurality of the workpieces in the loaded magazine is pushed across the gap and into the empty magazine at one time.

8 Claims, 11 Drawing Sheets

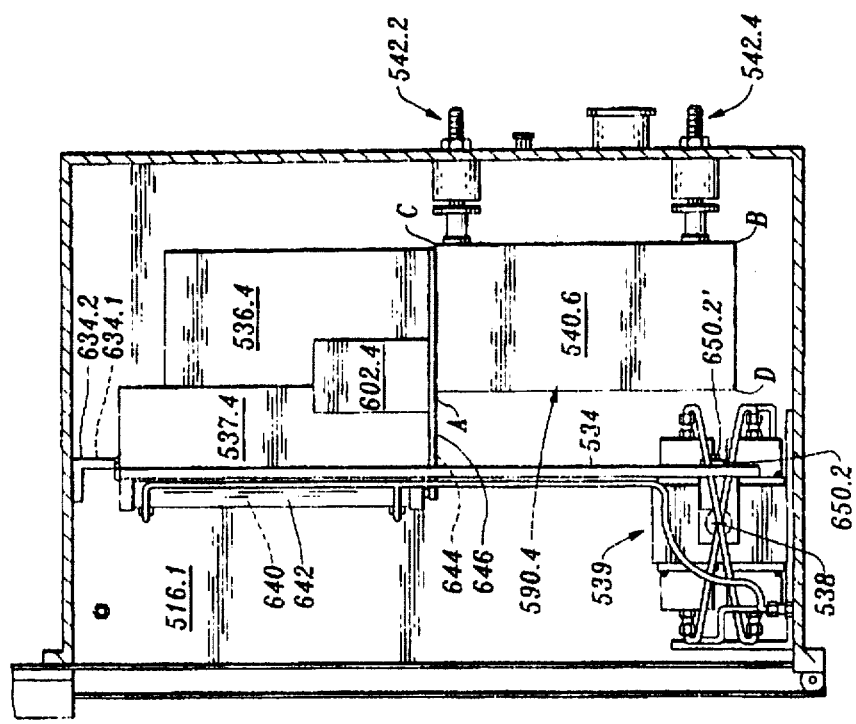
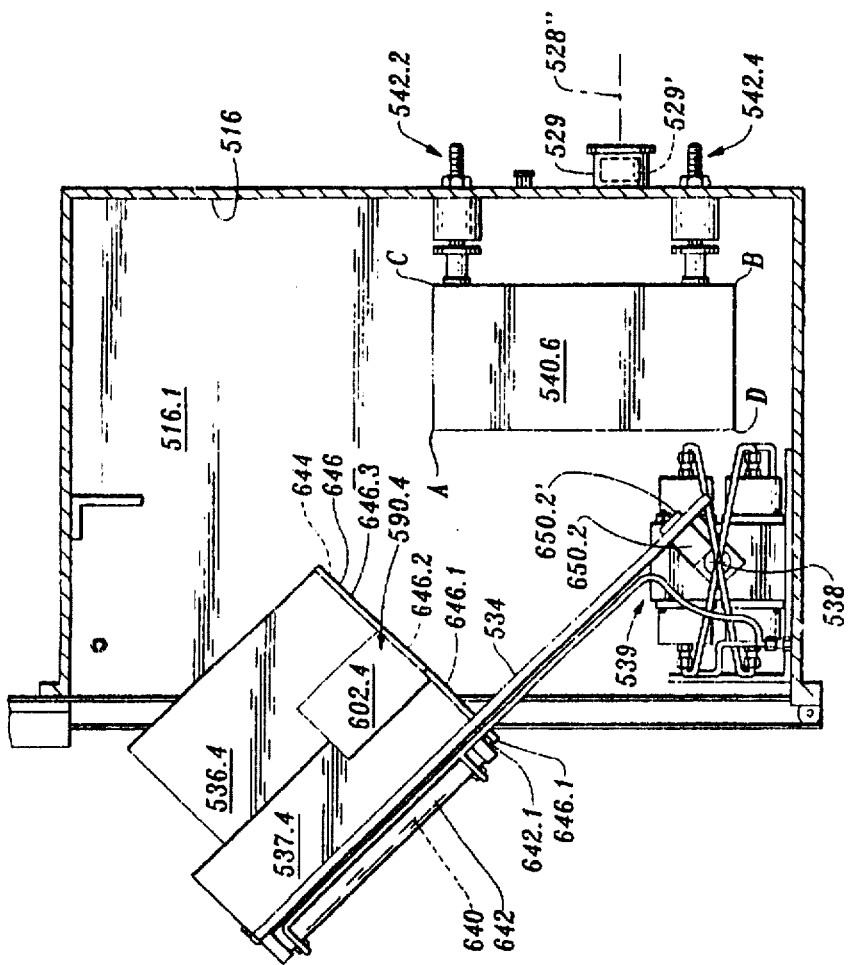

METHODS AND APPARATUS FOR PLASMA TREATMENT OF WORKPIECES

This application is a continuation-in-part of copending application Ser. No. 08/350,320 filed on Dec. 5, 1994.

BACKGROUND OF THE INVENTION

1. Field of the Invention

The present invention relates to plasma discharge apparatus, and more particularly to methods and apparatus for plasma treatment of workpieces.

2. Description of the Prior Art

Methods and apparatus for plasma treatment of workpieces are well known in the prior art.

Among the apparatuses for plasma treatment of workpieces known in the prior art are the PX-250, PX-500, and PX-1000 Plasma Cleaning Systems currently made and sold by March Instruments, Inc., 125-J Mason Drive, Concord, Calif. 94520.

These PX series Plasma Cleaning Systems are used in various industries for cleaning a wide variety of workpieces, stripping various film layers, and modifying the surfaces of workpieces to improve wetability and/or bonding, as with Polymides. Typical workpieces which are treated by these PX series Plasma Cleaning Systems are hybrid integrated circuits, leadframes, multi-chip modules, medical and electronic devices, optical devices, plastic parts where bonding is required, flat panel image displays, and parts, components, and substrates thereof.

(The terms "etching" and "cleaning" are sometimes used synonymously in the plasma treatment art.)

Each PX series Plasma Cleaning System is comprised of a reaction chamber, a power source, and a process control module.

Each such reaction chamber may be provided with a vertical lift door which, when closed, forms a vacuum-tight seal with its associated door frame.

These reaction chambers are provided with vacuum and gas sources for selectively providing suitable atmospheres or plasma discharge media therewithin.

These reaction chambers are further provided with multiple removable shelves which can be configured as desired for downstream, direct or reaction ion etching, and other plasma discharge processes. These shelves serves as application electrodes for applying plasma discharge exciting voltages to the plasma discharge media contained within the reaction chambers in which they are mounted.

Different excitation power sources are made available in different PX series Plasma Cleaning Systems to fulfil the requirements of different applications, e.g., power sources having different power densities and frequencies. Automatic impedance matching networks are made available for ease of operation and consistent results.

The process control module of each PX series Plasma Cleaning System controls and monitors the vacuum and gas flow in the reaction chamber thereof, the discharge medium pressure in the reaction chamber, and the power level of the applied excitation power; and also controls the operating cycle of the Plasma Cleaning System of which it is a part by either elapsed time or endpoint detection. Further detailed information regarding PX series Plasma Cleaning Systems is currently available from March Instruments, Inc., 125-J Mason Drive, Concord, Calif. 94520.

Prior art apparatuses for the treatment of workpieces can in general be classified into two major types: (1) batch, in which a plurality of workpieces are placed inside a treatment chamber for simultaneous treatment, and (2) continuous, in which the workpieces to be treated are continuously, serially introduced into the treatment chamber, one at a time, and are individually removed from the treatment chamber after the treatment.

Examples of continuous workpiece treatment apparatuses are shown and described in U.S. Pat. Nos. 4,318,767 (Hijikata, et al.), 4,816,116 (Davis, et al.), 5,286,296 and 5,302,077 (Sato et al.), 5,292,393 (Maydan et al.), 5,259,942 (Kempf), 5,310,410 (Begin, et al.), and 4,584,045 (Richards).

As is well known to those having ordinary skill in the art, such continuous workpiece treatment apparatuses and systems are very expensive, and are relatively slow in operation. Further, such continuous workpiece treatment systems have to be custom designed to integrate with the rest of the manufacturing process used for manufacturing the device of which the workpiece is a part or substrate.

By contrast, the prior art PX series Plasma Cleaning Systems are batch processing apparatuses the reaction chambers of which are adapted to contain plural workpiece magazines, each workpiece magazine containing a plurality of workpieces or integrally joined workpiece sets, e.g., leadframes.

By way of example, PX series Plasma Cleaning Systems are provided by March Instruments, Inc., which can process five magazines, containing about thirty leadframes per magazine, in about thirty minutes.

The term "prior art" as used herein or in any statement made in connection with this patent application or any patent or patents issuing herefrom means only that any document or thing referred to as prior art bears, directly or inferentially, a date which is earlier than the effective filing date hereof.

SUMMARY OF THE INVENTION

Accordingly, it is an object of the present invention to provide-magazine-fed, batch-processing plasma treatment apparatuses which are capable of processing workpieces more uniformly than prior art magazine-fed, batch-processing plasma treatment apparatuses.

Another object of the present invention is to prevent damage to workpieces due to overetching in local workpiece surface areas.

Yet another object of the present invention is to provide magazine-fed plasma treatment apparatus for treating leadframes in which the treatment of the leadframes is highly uniform and yet no leadframe ever completely leaves its associates magazine grooves or the like during a complete treatment cycle.

Another object of the present invention is to provide magazine-fed, batch-processing plasma treatment apparatuses which are capable of processing workpieces more rapidly than prior art magazine-fed, batch-processing plasma treatment apparatuses.

Yet another object of the present invention is to provide plasma treatment apparatuses which are less costly than continuous-processing plasma treatment apparatuses of the prior art.

A further object of the present invention is to provide plasma treatment apparatuses which are more flexible in their application than prior art plasma treatment apparatuses.

A yet further object of the present invention is to provide plasma treatment apparatuses which require little custom fitting to adept them to particular workpieces, workpiece magazines, or modes of plasma treatment.

Another object of the present invention is to provide novel modes of operation of magazine-fed, batch-processing plasma treatment apparatuses whereby to effect one or more of the above-stated objects.

Other objects of the present invention will in part be obvious and will in part appear hereinafter.

The present invention, accordingly, comprises the several steps and the relation of one or more of such steps with respect to each of the others, and the apparatus embodying features of construction, combinations of elements, and arrangements of parts which are adapted to effect such steps, all as exemplified in the following disclosure, and the scope of the present invention will be indicated in the claims appended hereto.

In accordance with a principal feature of the present invention the reaction chamber of a plasma treating apparatus of the present invention is provided with magazine locating means for locating a first workpiece magazine and a second workpiece magazine in a predetermined juxtaposition such that a workpiece disposed on a particular pair of workpiece supporting members of said first magazine, when pushed through said first magazine, is received upon the corresponding pair of workpiece supporting members of said second magazine.

In accordance with another principal feature of the present invention said plasma treating apparatus of the present invention further comprises workpiece pushing means for pushing workpieces resting upon particular workpiece supporting members of said first workpiece magazine into said second workpiece magazine and onto the corresponding workpiece supporting members of said second workpiece magazine.

In accordance with yet another principal feature of the present invention said magazine locating means are so constructed and arranged that when said first and second workpiece magazines are disposed therein the adjacent faces thereof are spaced apart by a sufficient distance so that workpieces traversing that distance at a predetermined speed will be completely treated when, at the same time, a predetermined plasma density of a particular plasma is maintained in the space between said workpiece magazines.

In accordance with a further principal feature of the present invention said plasma treating apparatus of the present invention further comprises automatic control means for automatically controlling the rate of advance of said pushing means and thereby controlling the rate of speed at which said workpieces traverse the distance or gap between said workpiece magazines.

In accordance with a yet further principal feature of the present invention said automatic control means also serves to automatically control vacuum producing means, plasma gas supply means and exciting voltage supply means of said plasma treating apparatus in such manner as to produce in the reaction chamber of said plasma treating apparatus plasma of sufficient density to fully treat all of the workpieces traversing said distance or gap between said first and second workpiece magazines at one time.

In accordance with another principal feature of the present invention the pushing means and automatic control means of said plasma treating apparatus are so constructed and arranged as to simultaneously push all of the workpieces in a first workpiece magazine disposed in said locating means into a second workpiece magazine disposed in said locating means.

In accordance with yet another principal feature of the present invention the pushing means and the automatic control means of said plasma treating apparatus are so constructed and arranged as to serially push subpluralities of the workpieces in said first workpiece magazine simultaneously into said second workpiece magazine during the existence of a treating plasma in the gap between said workpiece magazines.

In accordance with a further principal feature of the present invention a method of plasma treatment of workpieces contained in a first or supply workpiece magazine comprises the steps of: so juxtaposing said first workpiece magazine and a second workpiece magazine that workpieces can be pushed out of said first workpiece magazine, across a gap between said workpiece magazines, and into said second workpiece magazine; pushing said workpieces from said first workpiece magazine and into said second workpiece magazine across said gap, and providing a treating plasma in said gap during the transfer of said workpieces from said first workpiece magazine to said second workpiece magazine.

In accordance with a yet further principal feature of the present invention a second method of plasma treatment of workpieces comprises the steps of sequentially pushing subpluralities of the workpieces in said first workpiece magazine across said gap and in said second workpiece magazine, and producing treating plasma in said gap during each transit of a subplurality of said workpieces across said gap.

In accordance with a yet further principal feature of the present invention a plasma treatment apparatus of the present invention includes at least one magazine receiving device which is adapted to receive at least one workpiece magazine and to reposition the same so that the workpieces contained therein can emerge therefrom under the urging of gravitational force alone.

In accordance with yet another feature of the present invention said apparatus further comprises workpiece support means which prevent workpieces from completely emerging from their associated magazines under the urging of gravitational force.

In accordance with a further principal feature of the present invention said workpiece support means are power-operated under the control of programmable automatic control means.

For a fuller understanding of the nature and objects of present invention, reference should be had to the following detailed description, taken in connection with the accompanying drawings.

BRIEF DESCRIPTION OF THE DRAWINGS

FIG. 19 is a sectional side elevational view of the plasma treatment apparatus of the third preferred embodiment of the present invention, with its door open, showing the processing shelf in an intermediate tilted position substantially similar to that shown in FIG. 18;

FIG. 20 is a sectional side elevational view of the plasma treatment apparatus of the third preferred embodiment of the present invention, illustrating the processing shelf in the fully vertical position;

DESCRIPTION OF THE PREFERRED EMBODIMENTS

The First Preferred Embodiment.

Figure 1:
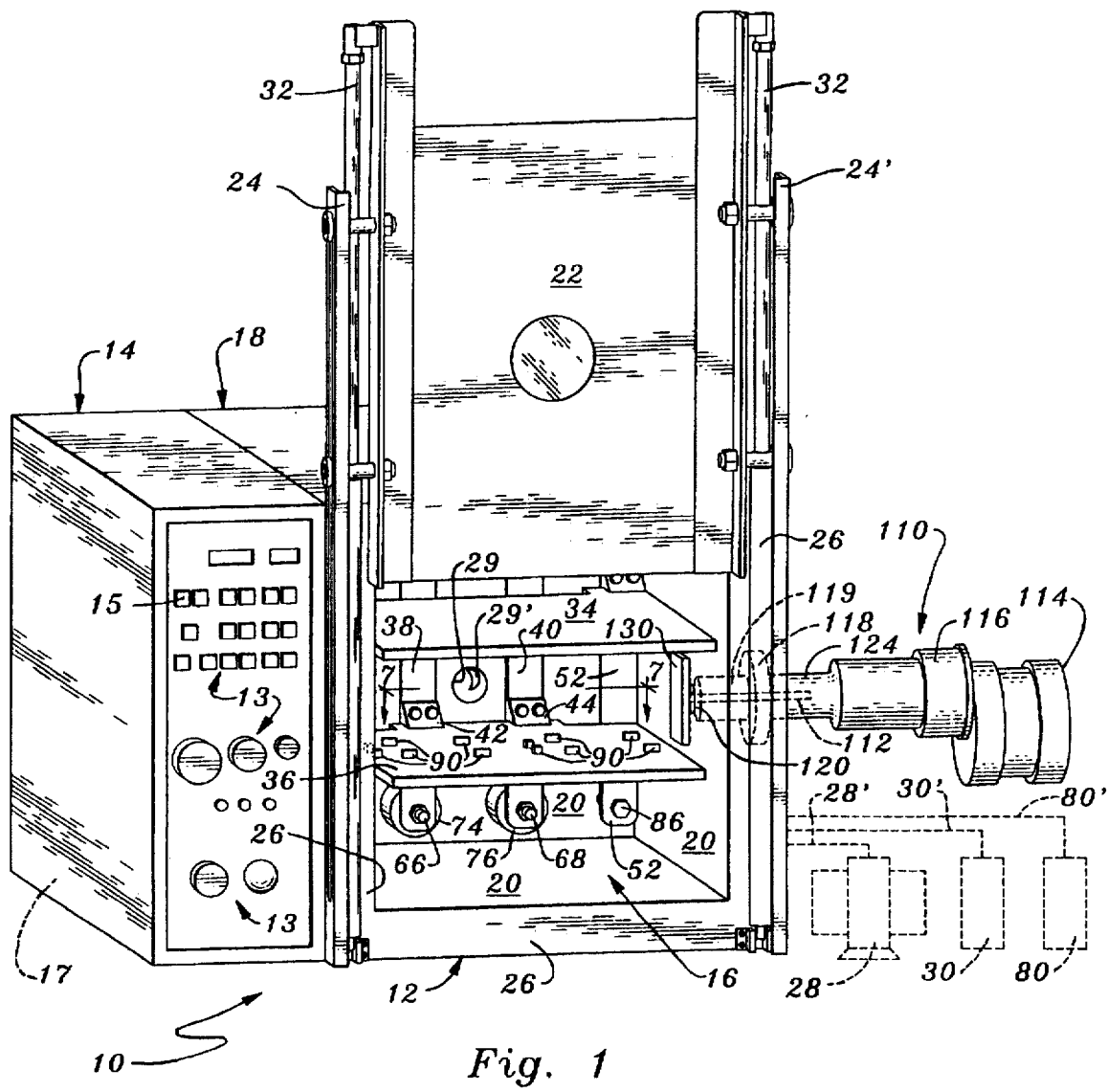
FIG. 1 is a perspective view of a magazine-fed, batch-processing plasma treatment apparatus of the first preferred embodiment of the present invention.

Referring now to FIG. 1, there is shown a magazine-fed, batch-processing plasma treatment apparatus 10 of the first preferred embodiment of the present invention.

Many parts and subsystems of plasma treatment apparatus 10 are substantially identical to the corresponding parts and subsystems of the PX series Plasma Cleaning Systems made and sold by March Instruments, Inc., of Concord, Calif., referred to hereinabove. All such corresponding parts and subsystems will be described only generally, and will sometimes hereinafter be identified by the suffix "PX-".

Copies of certain documents regularly supplied to purchasers of PX series Plasma Cleaning Systems are supplied to the United States Patent and Trademark Office herewith as Appendices A through E.

Referring again to FIG. 1, it will be seen that plasma treatment apparatus 10 is comprised of two principal components, viz., reaction chamber assembly 12 and process control module 14, on the front panel of which are a plurality of manually operable and human-readable controls 13.

In keeping with ordinary usage of the art, both reaction chamber assembly 12 and the reaction chamber 16 defined thereby may sometimes be collectively designated by the term "reaction chamber" hereinafter.

Reaction chamber assembly 12 is comprised of an outer shell or housing 18 which contains a reaction chamber shell 20, which is fixedly located within housing 18 by suitable mounting means.

Reaction chamber assembly 12 is further comprised of a door 22 and door track means 24, 24' upon which door 22 is slidably mounted for sliding movement between its "open" position shown in FIG. 1 and its downwardmost (or "closed") position in which a gasket affixed to its inner face (not shown) is pressed against door frame 26, and thus provides a vacuum-tight seal whereby the interior of reaction chamber 16 is completely isolated from the ambient atmosphere surrounding plasma treatment apparatus 10.

Thus, when door 22 is completely closed and sealed to doorframe 26, reaction chamber 16 can be evacuated by means of an external vacuum pump 28, through a vacuum hose 28', a solenoid valve 29', and a port 29 in the back wall of reaction chamber 16. Vacuum pump 28 may be an ALCATEL Model No. UT2063CP, Chemical Series, Two-Stage, Rotary Vane Pump. Solenoid valve 29' is controlled by control means 17.

Plasma treatment apparatus 10 is also comprised of a gas source 30 from which suitable processing gas may be injected into reaction chamber 16 under the control of control means 17 which constitute a part of process control module 14.

As also seen in FIG. 1, plasma treatment apparatus 10 is further comprised of a pair of power cylinders 32 which are adapted to operate door 22 between its open position (shown in FIG. 1) and its fully closed position under control of control means 17.

Suitable pneumatic power cylinders 32 may be commercially purchased under the trade designation BIMBA Part No. CF-0921-DXP, 1 1/16 inch bore, double acting air cylinder with adjustable front head cushion. The operation of power cylinders 32, and thus the positioning of door 22, is controlled by control means 17.

Referring again to FIG. 1, it will be seen that reaction chamber 16 contains a pair of shelves 34, 36.

Shelves 34, 36 are PX-shelves, and are fabricated from rigid, highly conductive material such as 1/4 inch (minimum) thickness aluminum plate.

Figure 3A:
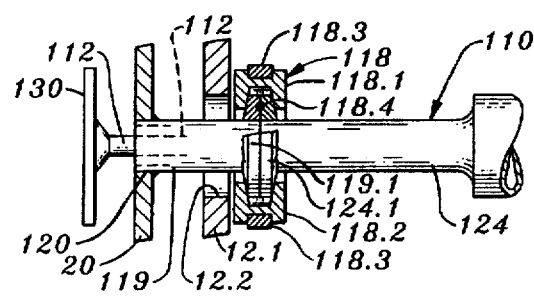
FIG. 3A shows the means used to vacuum-tightly couple the horizontal drive system to the reaction chamber.
Figure 3:
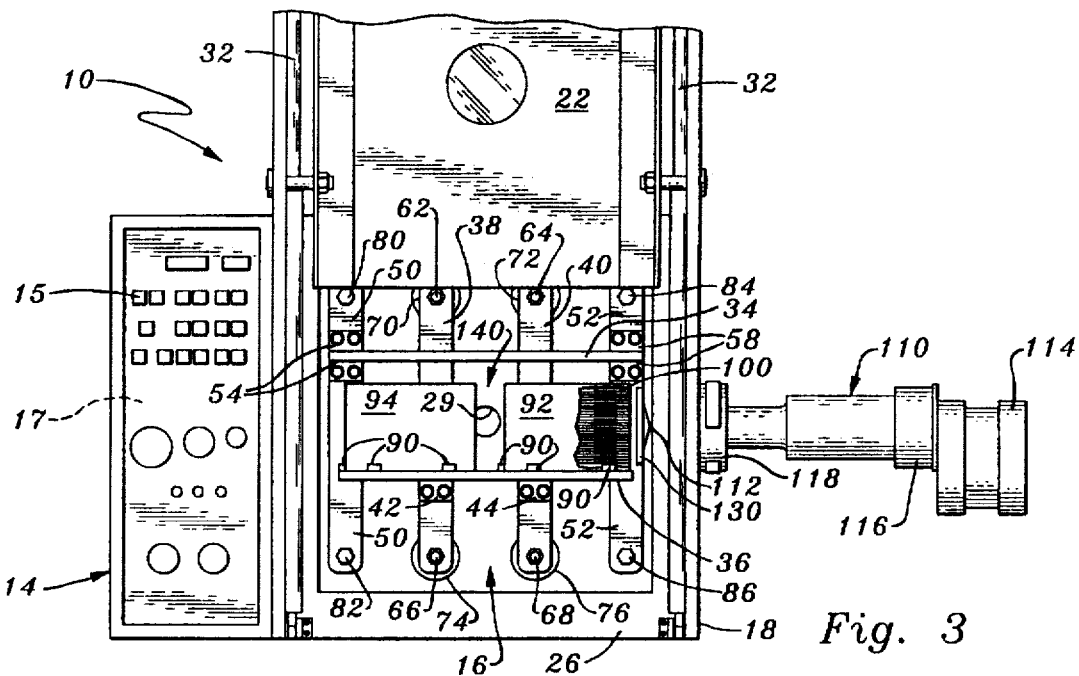
FIG. 3 is a front elevational view of the magazine-fed, batch-processing plasma treatment apparatus of the first preferred embodiment of the present invention shown in FIG. 1, loaded with a workpiece supply magazine and a workpiece receiving magazine of the kind shown in FIG. 2.

As further seen in FIG. 1, lower shelf 36 is mounted in cantilever fashion on a pair of rigid, highly conductive busses 38, 40 by means of suitable brackets 42 and 44 shown in FIGS. 1 and 3.

As may best be seen by comparison of FIGS. 1 and 3, shelf 34 is mounted in cantilever fashion on a pair of ground busses 50, 52 by means of brackets 54 and 58.

Figure 14:
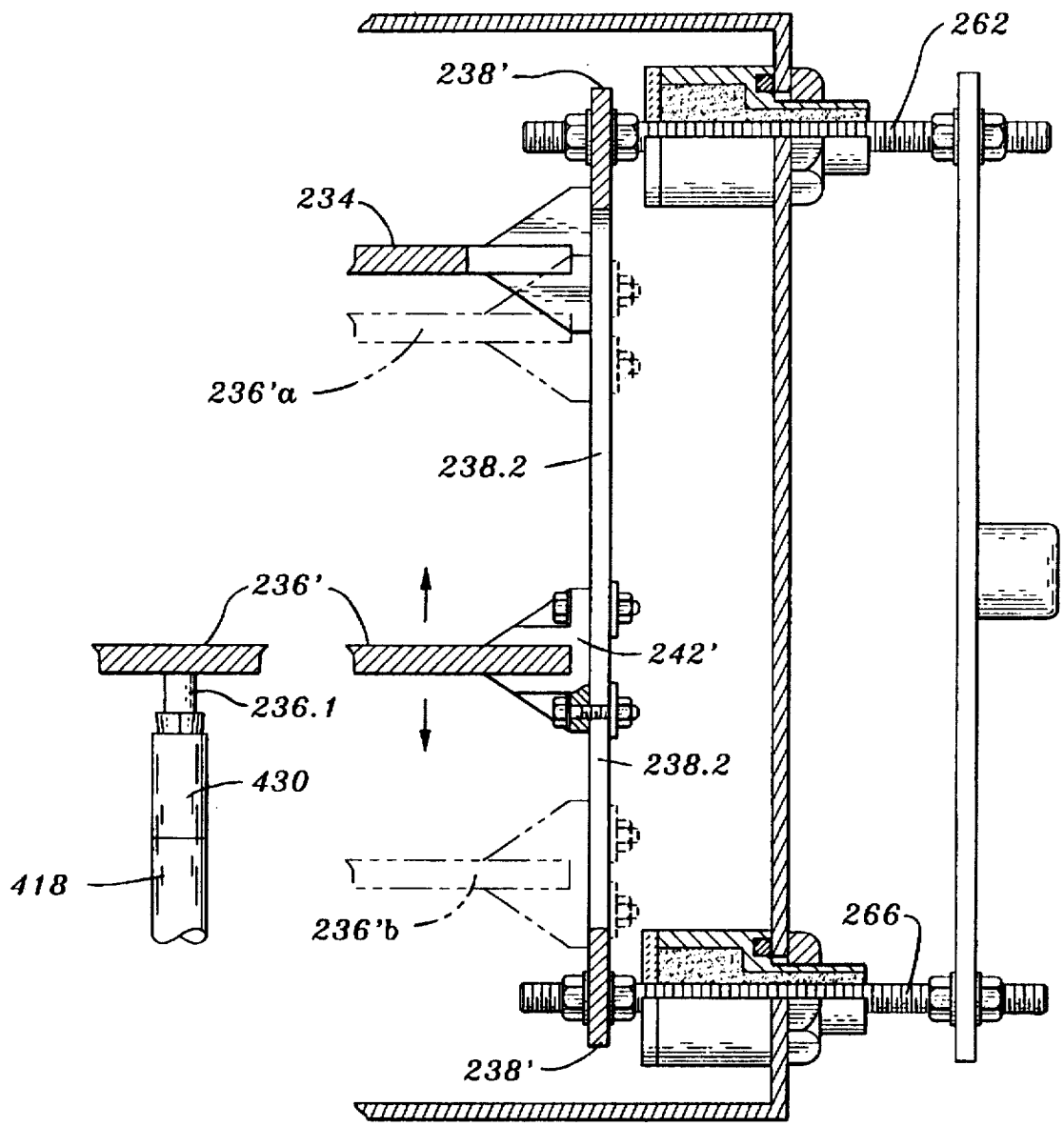
FIG. 14 is a partial sectional elevational view of the plasma treatment apparatus of the second preferred embodiment of the present invention, illustrating the grounded workpiece shelf and the powered workpiece shelf thereof and the means for supporting and energizing the same.

As may also be seen by comparison of FIGS. 1 and 3, busses 38 and 40 are attached to the inner ends of threaded conductors 62, 64, 66, 68, each of which is a part of a respective vacuum-tight feed-through insulator 70, 72, 74, 76. A suitable vacuum-tight feed-through insulator for this application is illustrated in FIG. 14, and is commercially available under the commercial designation DOUGLAS ENGINEERING Part No. SS-VAC-2 Studseal Feedthru.

Thus, it will be understood by those having ordinary skill in the art, informed by the present disclosure, that highly conductive lower shelf 36 is rigidly mounted (by means of buss bars 38, 40) on four conductors 62, 64, 66, 68, all of which conductors pass through the rear wall of reaction chamber shell 20 and are insulated therefrom.

The outer ends of each vertically disposed pair of conductors, 62, 66 and 64, 68, are interconnected by means of rigid conductor members, and radio frequency coupling means are connected to those conductors.

In the manner exemplified in the PX series Plasma Cleaning Systems, said coupling means are coupled to suitable external solid state radio frequency generating means 80 (FIG. 1) via suitable cables 80'.

As best seen by comparison of FIGS. 1 and 3, the ends of busses 50 and 52 are directly, conductively connected to the rear wall of reaction chamber shelf 20 by means of conductive bolts 80, 82, 84, 86, and thus conductive shelf 34 is directly, conductively connected to reaction chamber shell 20, which is itself highly conductive.

As will now be apparent to those having ordinary skill in the art, informed by the present disclosure, a radio frequency field will be established between shelf 34 and shelf 36 whenever external solid state radio frequency generator 80 (FIG. 1) is energized under the control of control means 17.

It is to be understood that in general all of the hereinabove described components, structures and subsystems are PX-components, PX-structures and PX-subsystems, i.e., that corresponding components, structures and subsystems are found in PX-series Plasma Cleaning Systems known in the prior art.

It is further to be understood that control means of the type found in process control module 14 are such that the provision of the same would be well within the scope of one having ordinary skill in the art, familiar with the plasma cleaning systems of the prior art.

Referring now to FIG. 1, and comparing the same with FIG. 3, it will be seen that lower shelf 36 is provided on its upper face with a plurality of projecting dogs or stops 90. It is to be understood that dogs or stops 90 constitute a novel feature of the present invention, and are not found in PX-series Plasma Cleaning Systems of the prior art.

Figure 7:
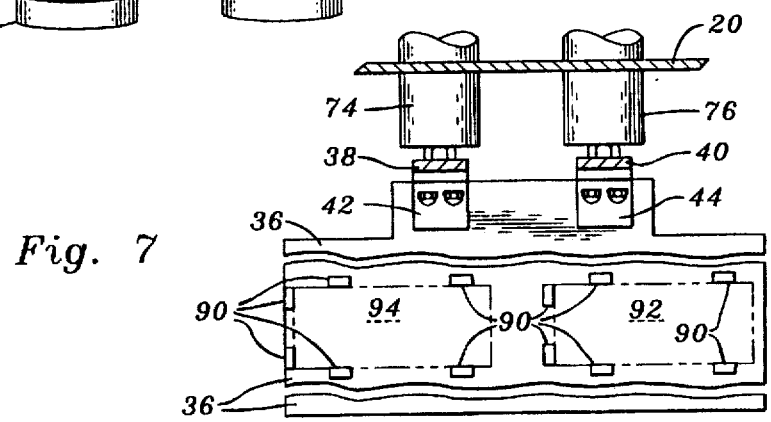
FIG. 7 is a partial plan view, partly in section, of the workpiece carrying shelf of the plasma treatment apparatus of the second preferred embodiment of the present invention, taken on plane 7—7 of FIG. 1.

As may be seen by comparison of FIGS. 3 and 7, stops 90 are so arranged on shelf 36 as to maintain two workpiece magazines 92, 94 in respective predetermined positions on shelf 36, in which positions they are in a predetermined juxtaposition and are spaced apart by a predetermined distance, sometimes called herein the "processing gap length".

Workpiece magazines 92 and 94, and many of the workpiece magazines used in connection with plasma treatment apparatuses of the present invention, are standard workpiece magazines which are very widely used and well known in the integrated circuit industry.

Figure 2:
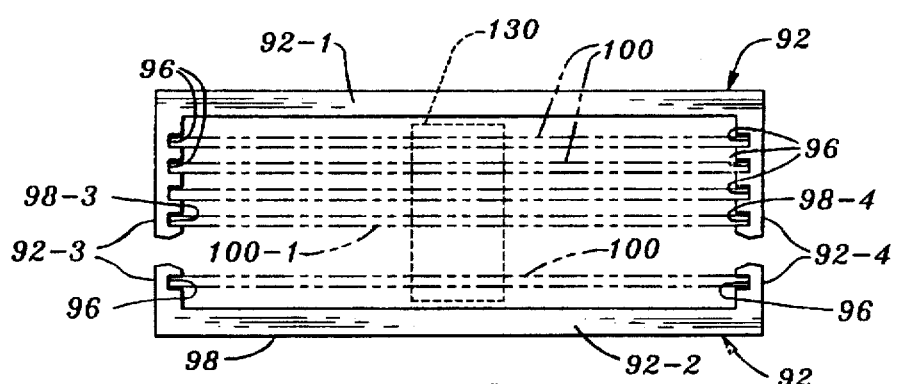
FIG. 2 is a partial elevational view of a loaded workpiece magazine of the kind used in connection with the plasma treatment apparatus of the first preferred embodiment of the present invention shown in FIG. 1.

Referring now to FIG. 2 there is shown a partial end view of workpiece magazine 92.

As will be apparent to those having ordinary skill in the art, viewing FIG. 2, workpiece magazine 92 is a rigid, elongated tubular member of rectangular cross-section comprised of a planar top member 92-1, and planar bottom member 92-2, and two planar side members 92-3, 92-4.

In the preferred design of workpiece magazine 92 the top and bottom planar members 92-1, 92-2 and the side members 92-3, 92-4 are all parts of a single, integral body of rigid metallic material.

As also seen in FIG. 2, the inner faces of sidewalls 92-3, 92-4 of workpiece magazine 92 are provided with corresponding pluralities of grooves 96, each groove in sidewall 92-3 having a corresponding groove in sidewall 92-4 which is at the same distance from the bottom of bottom member 92-2 as its corresponding groove in sidewall 92-3.

Thus, for example, it will be seen that groove 98-3 in sidewall 92-3 is at the same distance from the lower face 98 of bottom member 92-2 as is its corresponding groove 98-4.

Additionally, it will be understood that workpiece magazines 92 and 94 can be so juxtaposed that any workpiece 100 (FIG. 2) which is pushed out of workpiece magazine 92 and toward workpiece magazine 94 will, when pushed sufficiently far, enter the groove pair in workpiece 94 corresponding to the workpiece pair of workpiece magazine 92 from which it is being pushed.

Thus, when workpiece magazines 92 and 94 are thus juxtaposed and workpiece 100-1 is pushed out of grooves 98-3 and 98-4 of workpiece magazine 92 it will enter the corresponding grooves 98-3 and 98-4 of workpiece magazine 94.

As will now by understood by those having ordinary skill in the art, informed by the present disclosure, workpiece magazines 92 and 94 are so juxtaposed by stops 90 (FIG. 7) that when any workpiece contained in a particular groove pair of workpiece magazine 92 is pushed out of magazine 92 and toward magazine 94 that workpiece will, after passing through the processing gap between magazines 92 and 94, enter the corresponding groove pair in workpiece magazine 94.

Referring again to FIG. 1, there is further shown a horizontal drive system 110 which includes a pushrod 112, a drive motor 114 and a gear reducer 116.

As best seen in FIG. 3, horizontal drive system 110 is mounted on housing 18 by means of a mounting clamp 118.

As seen in FIG. 1, pushrod 112 of horizontal drive system 110 passes through an aperture 120 which extends through reaction chamber shell 20.

In the first preferred embodiment of the present invention horizontal drive system 110 is an MDC VACUUM PROD- UCTS Model No. K075-BLM-12 Linear Motion Feedthrough with AC motor drive.

Horizontal drive system 110 includes vacuum sealing means and mounting clamp (flange clamp) 118 which vacuum-tightly seals the open outer end 124 of the housing of horizontal drive system 110 to reaction chamber 16, via an intermediate tube.

Referring now to FIG. 3A, it will be seen that the open outer end 124 of horizontal drive system 110 is provided with a flange 124.1. The central opening of flange 124.1 close-fittingly receives end portion 124 of horizontal drive system 110.

End portion 124 is vacuum-tightly fixed in the central opening of flange 124.1, as by welding or braising.

The outer extremity of end portion 124 does not extend beyond the plane of the outer face of flange 124.1.

A short tube 119 is close-fittingly received in a circular opening 120 in the shell 20 of reaction chamber 16, and is vacuum-tightly affixed therein, as by welding or braising.

The outer end of tube 119, remote from shell 20, is provided with a flange 119.1 which is vacuum-tightly affixed to tube 119, as by welding or brazing. The end of tube 119 contained in flange 119.1 does not project beyond the planar outer face of flange 119.1.

Tube 119 passes through an aperture 12.2 in outer wall 12.1 of reaction chamber assembly 12.

Aperture 12.2 is sufficiently large to permit flange 119.1 to pass therethrough.

It is to be noted that the outer face of flange 124.1 is planar, as is the outer face of flange 119.1.

It is further to be noted that the inner face of each flange 124.1, 119.1 is chamfered, i.e., lies on a cone of large apical angle which is coaxial with the common axis of tube 119 and outer end 124.

It is yet further to be noted that the planar outer surfaces of flanges 119.1 and 124.1 are both grooved to define between them a channel which is adapted to receive a resilient sealing ring 118.4.

In the known manner, flange clamp 118 is comprised of two major parts 118.1, 118.2, each of which is semi-circular in configuration and defines an inner channel the opposing walls of which are chamfered to match the chamfer of the inner faces of flanges 119.1, 124.1.

Flange clamp 118 is further comprised of a band 118.3 which, when clamp 118 is assembled, is contained in grooves formed in the outer surfaces of clamp members 118.1, 118.2.

In the well known manner, screw means or the like are provided whereby to tension band 118.3, and thus to jam the planar outer faces of flanges 119.1, 124.1 together, thus compressing resilient sealing ring 118.4 into its associated grooves, and thus vacuum-tightly sealing the flat outer faces of flanges 119.1 and 124.1 together.

Thus, it will be seen that end portion 124 of the housing of horizontal drive system 110 is vacuum-tightly affixed to the outer end of tube 119.

It will thus be seen that the interior of the housing of horizontal drive system 110 is in vacuum-tight communication with the interior of reaction chamber 16.

As may be seen by comparison of FIGS. 1 and 3, a contact plate 130 is rigidly mounted on the outer end of pushrod 112.

In the preferred embodiments of the present invention shown and described herein, contact plate 130 is fabricated from ceramic material, and is rigidly mounted on the outer end of pushrod 112 in such manner as to remain at all times in its "major axis vertical" orientation as shown in FIG. 1.

As shown in FIG. 2, contact plate 130 is so constructed and arranged as to freely pass into the interior of workpiece magazine 92 when pushrod 112 is driven forward into reaction chamber 20 by drive motor 114.

It is to be understood that the excitation current for operating drive motor 114 is derived from suitable motor control means which is a part of the control system contained in process control module 14.

The addition of such drive motor excitation current supply means to the control means found in the process control module of the PX-Series Plasma Cleaning Systems of the prior art is within the scope of those having ordinary skill in the process control art.

The time period consumed by the translation of workpieces 100 from their position of rest in magazine 92 to their position of rest in magazine 94 (FIG. 3) varies in accordance with the workpiece being done by apparatus 10.

Thus, it will be understood that the operation of drive motor 114 and the consequent positioning of contact plate 130 within reaction chamber shell 20 is automatically carried out by control means 17, in timed coordination with the operation of door power cylinders 32, vacuum pump 28, gas source 30, and radio frequency power source 80, all as determined by the settings of the manually operable controls found on the front panel of process control module 14.

At the step of the operating cycle of plasma treatment apparatus 10 shown in FIG. 3, door 22 of reaction chamber 16 is fully open, and workpiece magazines 92 and 94 have just previously been manually or robotically deposited on powered shelf 36 in the mutually aligned juxtaposition determined by stops 90. At this stage of the operating cycle of plasma treatment apparatus 10 workpiece supply magazine 92 is on the right as viewed through open doorframe 26, and is fully loaded with workpieces 100, e.g., leadframes, none of which project from workpiece magazine 92.

At the same time, receiving magazine 94 is located on the left as seen through open doorframe 26, and contains no workpieces.

At the same time, contact plate 130, having been fully retracted by drive motor 114, etc., is located in its "home" position close to the righthand wall of reaction chamber 16.

Following the stage of the operating cycle of plasma treatment apparatus 10 shown in FIG. 3, which may sometimes herein be called the "initial stage", and the controls on the front panel of process control module 14 having been properly set to cause control means 17 to operate the components in plasma treatment apparatus 10 to carry out the desired operating cycle, that operating cycle is caused to commence by manual depression of pushbutton 15.

In response to signals produced by control means 17 located in process control module 14, power cylinders 32 operate to fully close door 22, and thus to isolate the space within reaction chamber 16 from ambient atmosphere.

Vacuum pump 28 is then energized under the control of control means 17 to evacuate reaction chamber 16 to a vacuum of approximately 50 to 80 mTORR.

By means of signals supplied from control means 17, gas source 30 is caused to inject a suitable processing gas or combination of gasses, e.g., Argon, Oxygen, Helium, Hydrogen, Freon 11, Freon 14, Freon 15, Freon 23, Freon 116, or a combination thereof, into reaction chamber 16 to a partial pressure between 100 mTORR and 1.2 TORR, depending on the treatment being carried out.

Radio frequency generator 80 is then energized, under the control of control means 17, to produce a plasma between shelves 34 and 36, and particularly in processing gap 140 between the mutually confronting adjacent faces of workpiece magazines 92 and 94.

Figures 4, 5:
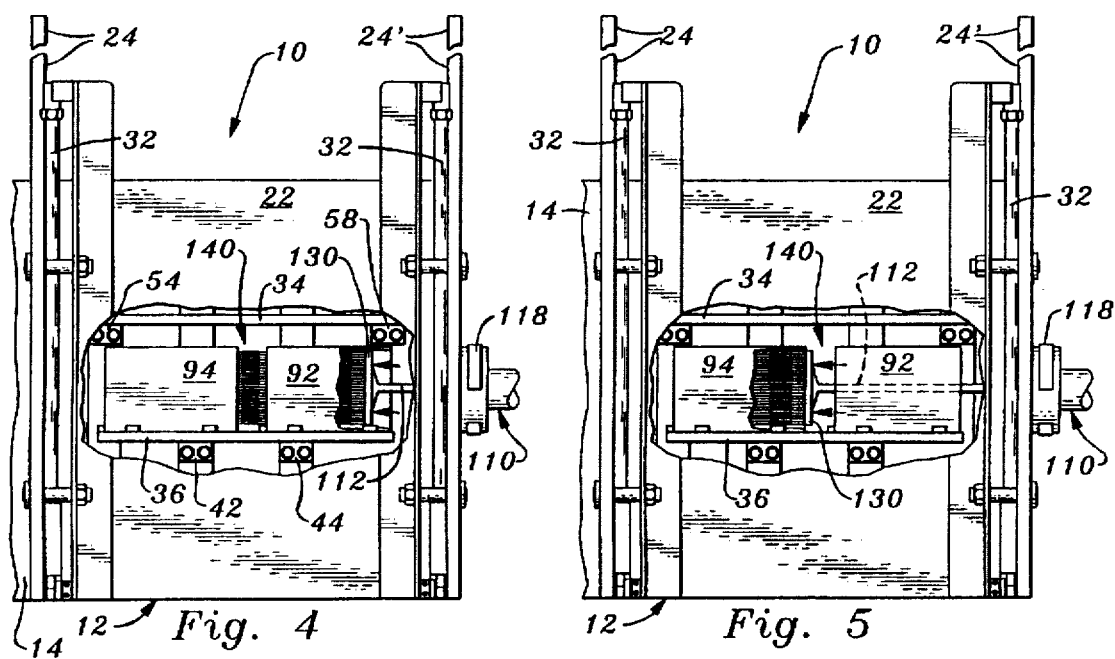
FIGS. 4 and 5 illustrate two different stages of the plasma treatment of a magazine load of workpieces in the plasma treatment apparatus of the first preferred embodiment of the present invention shown in FIGS. 1 and 3.

After the achievement of the necessary plasma density in processing gap 140, drive motor 114 is energized by control means 17, and thus contact plate 130 begins to move to the left as seen in FIG. 3, pushing all of the workpieces 100 contained in workpiece magazine 92 out of workpiece magazine 92 and into workpiece magazine 94 (FIG. 4) at a predetermined rate of translation previously programmed into control means 17.

The advancing movement of contact plate 130 continues, under the control of control means 17, at said predetermined rate of translation, until all of the workpieces 100 from supply magazine 92 have been fully driven into their position of rest in receiving magazine 94 (FIG. 5), at which time the advancing motion of contact plate 130 is halted.

Retracting motion of contact plate 130, toward its "home" position, is then commenced under the control of control means 17, and, under the control of control means 17, this retracting motion continues until contact plate 130 has returned to its "home" position (FIG. 3), whereupon the energization of drive motor 114 is discontinued.

During the retraction of contact plate 130, or shortly thereafter, radio frequency source 80 is deenergized, the previously injected gas is vented to ambient atmosphere, chamber 16 and its associated gas connections are purged, e.g., with Nitrogen gas, and then air under atmospheric pressure is admitted to reaction chamber 16, all under the control of control means 17.

Door 22 is then opened and lifted to its fully open position (FIG. 1) by power cylinders 32, under the control of control means 17; whereafter empty supply magazine 92 and receiving magazine 94, now loaded with plasma-cleaned workpieces, may be manually or robotically removed from reaction chamber 16, the processing cycle of plasma treatment apparatus 10 then being completed.

The Second Preferred Embodiment.

Figure 6:
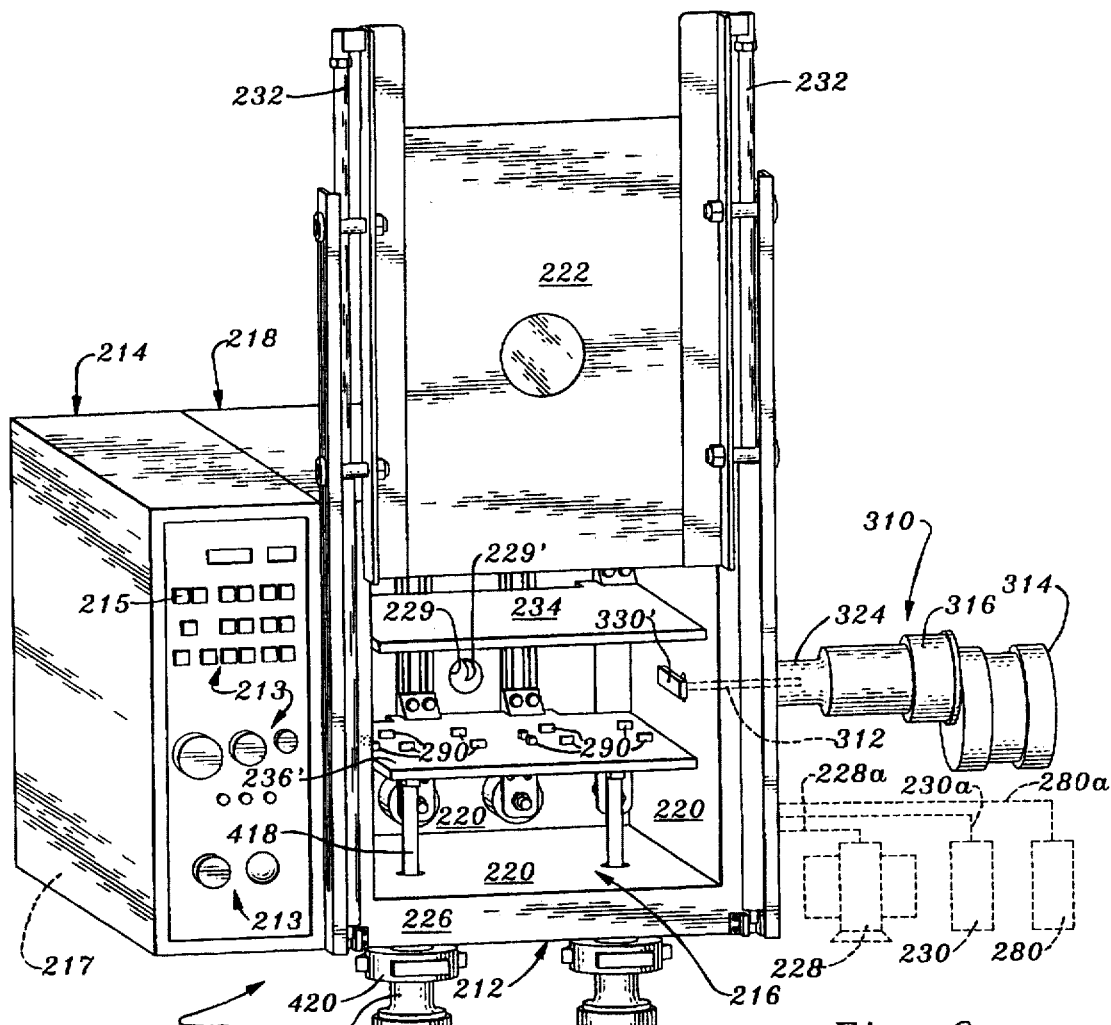
FIG. 6 is a perspective view of a magazine-fed, batch-processing plasma treatment apparatus of the second preferred embodiment of the present invention.

Referring now to FIG. 6, there is shown a magazine-fed, batch-processing plasma treatment apparatus 210 of the second preferred embodiment of the present invention.

Many parts and subsystems of plasma treatment apparatus 210 are substantially identical to the corresponding parts and subsystems of plasma treatment apparatus 10 of the first preferred embodiment of the present invention. Thus, all of the parts and subsystems of plasma treatment apparatus 210 of the second preferred embodiment of the present invention which are substantially identical to corresponding parts or subsystems of plasma treatment apparatus 10 of the first preferred embodiment will hereinafter be designated by the same reference numeral as that of the corresponding part or subsystem of plasma treatment apparatus 10 of the first preferred embodiment, augmented by 200.

Further, the same reference numeral practice is adopted herein with respect to parts and subsystems of the first preferred embodiment which are modified in ways described hereinafter for use in plasma treatment apparatus 210 of the second preferred embodiment, except that a prime mark (') will be added to each such modified part or subsystem reference numeral.

Thus, since the vertically sliding door of the second preferred embodiment of the present invention (FIG. 6) is substantially identical to sliding door 22 of the first preferred embodiment of the present invention (FIG. 3), the vertically sliding door of the second preferred embodiment will be designated by the reference numeral 222.

By way of further example, since the horizontal drive system of the second preferred embodiment of the present invention is substantially identical to the horizontal drive system 110 of the first preferred embodiment of the present invention (FIG. 1), the horizontal drive system of the second preferred embodiment of the present invention will hereinafter be designated by the reference numeral 310.

Yet further, the process control module of the second preferred embodiment of the present invention, which is a modified form of process control module 14 of the first preferred embodiment, will be designated herein by the reference numeral 314'.

It is further to be understood that all parts and subsystems of the second preferred embodiment of the present invention (FIG. 6) which are not substantially identical to corresponding parts or subsystems of the first preferred embodiment, nor modifications of corresponding parts or subsystems of the first preferred embodiment of the present invention described hereinafter, will hereinafter be designated by three-digit reference numerals the most significant digit of which is the numeral "4".

Thus, since, as may be seen by comparison of FIGS. 1 and 6, the two vertical drive systems of the second preferred embodiment (FIG. 6) are not identical to or described modifications of any subsystem of the first preferred embodiment (FIG. 1), they are designated respectively by the reference numerals 410 and 412.

Going, then, to FIG. 6, it will be seen that plasma treatment apparatus 210 of the second preferred embodiment of the present invention is comprised of reaction chamber assembly 212, which defines reaction chamber 216, and process control module 214.

Reaction chamber 216 can be vacuum-tightly closed by vertical sliding door 222, which is operated by power cylinders 232.

Plasma treatment apparatus 210 is further comprised of three separate or external devices, viz., vacuum pump 228, gas source 230, and radio frequency generator 280, each of which is coupled to plasma treatment apparatus 210 by means of suitable respectively associated conduits 228a, 230a, and 280a.

As also seen in FIG. 6, vertical drive systems 410 and 412, which are not found in the first preferred embodiment (FIG. 1), are larger and heavier duty systems than the horizontal drive system 310 of the second preferred embodiment.

A suitable commercially available drive system for use as drive systems 410 and 412 is the MDC Vacuum Products Model K200-BLM-6-03 Linear Motion Feed-Through with Stepper Motor Drive.

Vertical drive system 410, for example, is comprised of a drive motor 414, a gear reducer 416 and a pushrod 418.

Figure 8:
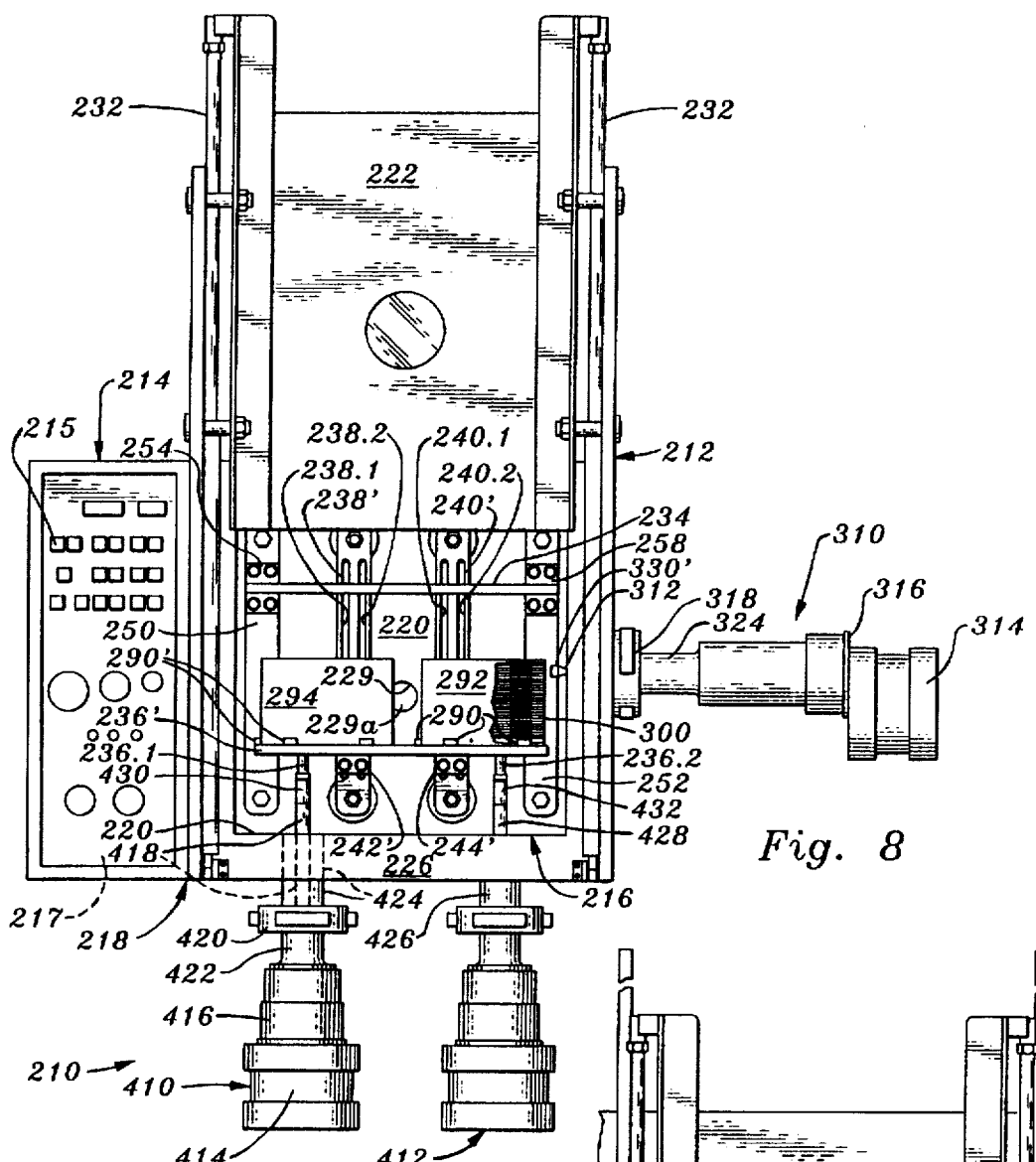
FIG. 8 is a front elevational view of the plasma treatment apparatus of the second preferred embodiment of the invention shown in perspective in FIG. 6, illustrating a workpiece supply magazine and a workpiece receiving magazine of the kind used in connection with the plasma treatment apparatus of FIG. 8 disposed upon the workpiece supporting shelf thereof.

As best seen in FIG. 8, vertical drive system 410 is mounted below housing 218 of reaction chamber assembly 212 by means of a mounting clamp (flange clamp) 420.

Mounting clamp 420 clamps a flange on the open outer end 422 of the housing of vertical drive system 410 to the flanged outer end of a tube 424 the inner end of which is vacuum-tightly fixed in an opening in the floor 220 of reaction chamber 216 and extends through an opening in the floor of housing 218 of reaction chamber assembly 212.

Thus, the interior of the housing of vertical drive system 410 is in communication with the interior of reaction chamber 216 via tube 424.

13

Vertical drive system 412 is substantially identical to vertical drive system 410, and is clamped to the flanged outer end of a tube 426 in the same way in which vertical drive system 410 is clamped to tube 424.

Thus, it will be seen by those having ordinary skill in the art, informed by the present disclosure, that when door 222 is fully closed, and reaction chamber 216 is evacuated, the interiors of the housings of drive systems 410 and 412 will at the same time be evacuated.

As also seen in FIG. 8, the outer end of pushrod 428 of vertical drive system 412 is located within reaction chamber 216.

It is also to be understood that the operation of the drive motors of vertical drive systems 410 and 412 is controlled by control means 217 located in process control module 214.

As further seen in FIG. 8, a collect 430 is affixed to the outer end of pushrod 418, and a collect 432 is affixed to the outer end of pushrod 428. The function of collets 430 and 432 will be disclosed hereinafter.

Referring again to FIG. 8, it will be seen that upper, grounded shelf 234 is substantially identical to shelf 34 of the first preferred embodiment, and is supported by clamps 254, 258 from buss bars 250, 252.

Lower, powered shelf 236', on the other hand, differs from lower, powered shelf 36 of the first preferred embodiment in two major particulars, viz., that it is provided with studs 236.1, 236.2 adapted for coaction with collets 430 and 432, and that it is adapted for vertical translation along its associated buss bars 238' and 240'.

The upper ends of studs 236.1 and 236.2 (FIG. 8) are affixed to shelf 236', and the lower ends of studs 236.1 and 236.2 are adapted to be received in collets 430 and 432, so that shelf 236' is affixed to the upper end of both of the respective pushrods 418 and 428 of the vertical drive systems 410 and 412.

As may be seen by comparison of FIGS. 8 and 14, shelf 236' is supported by brackets 242' and 244' which are slidably mounted on bus bars 238' and 240'.

As shown in FIG. 8, bus bar 238' is provided with two longitudinal slots 238.1 and 238.2, and bus bar 240' is provided with two longitudinal slots 240.1 and 240.2.

As may be seen by comparison of FIGS. 8 and 14, each vertically aligned pair of bolts passing through one of the brackets 242', 244' passes through one of the longitudinal slots 238.1, 238.2, 240.1, and 240.2.

As seen in FIG. 14, one of the vertically aligned pairs of bolts passing through bracket 242' also passes through longitudinal slot 238.2 in bus bar 238'. Also, as seen in FIG. 14, each of these two vertically aligned bolts is provided with a nut located behind bus bar 238'. None of the nuts engaged with any of the vertically aligned bolts is completely tightended.

Thus, it will be evident to those having ordinary skill in the art, informed by the present disclosure, that shelf 236' is slidably supported on bus bars 238', 240', and is positionable along bus bars 238', 240', i.e., is vertically positionable, by vertical drive systems 410, 412, under the control of control means 217 located in process control module 214.

As will also be evident to those having ordinary skill in the art, informed by the present disclosure, the radio frequency exciting voltage which, under the control of control means 217, can be applied to bus bars 238' and 240', is directly applied to shelf 236' independently of the vertical position of shelf 236'.

As further seen in FIG. 8, shelf 236' is provided with a plurality of dogs or stops 290' the configuration of which is substantially identical to the configuration of stops 90 on shelf 36 (FIG. 7).

Referring again to FIG. 6, it will be seen that contact plate 330' of the second preferred embodiment of the invention differs from contact plate 130 of the first preferred embodiment of the invention (FIG. 1) both in size and in orientation.

More particularly, it is to be noted that contact plate 330' is horizontal, i.e., its major dimension is parallel to the floor of reaction chamber 216.

As seen, for example, in FIG. 8, the vertical dimension of contact plate 330' is such that it can contact only three at a time of the workpieces 300 contained in workpiece magazine 292.

As seen in FIG. 6, the horizontal or major dimension of contact plate 330' is about four times as great as the vertical or minor dimension thereof.

It is to be understood, however, that contact plate 330' is mounted on the end of pushrod 312 of horizontal drive system 310 by means similar to the means by which contact plate 130 (FIG. 1) is mounted on the pushrod 112 of horizontal drive system 110 (FIG. 1).

Figure 9:
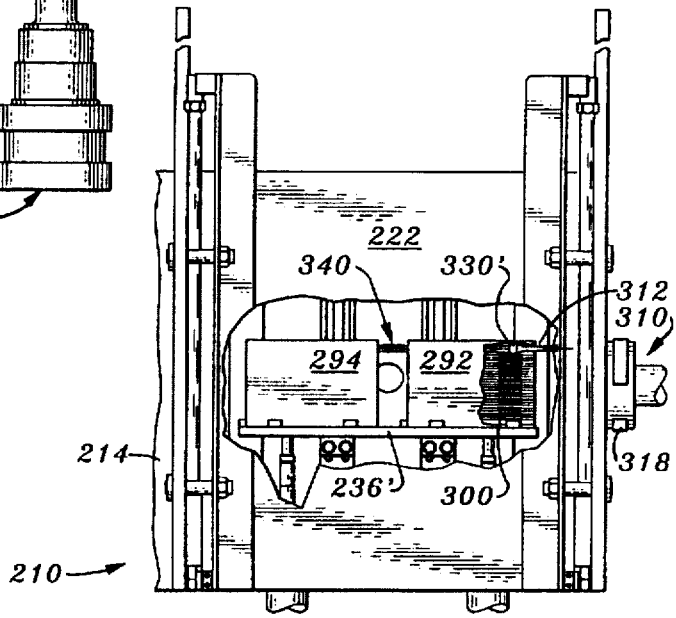
FIG. 9 is a partial elevational view of the plasma treatment apparatus of the second preferred embodiment of the invention, with its door closed, and the workpiece transfer apparatus thereof in operation.

Referring now to FIG. 9, and comparing the same with FIG. 8, it will be seen that door 222 of plasma treating apparatus 210 of the second preferred embodiment of the present invention has been closed by the action of power cylinders 232 under the control of control means 217 which operates a conventional bidirectional pneumatic control valve, which in turn serves to admit air from a local air pressure supply source separate from plasma treatment apparatus 210, selectively, to the cylinder volume above or below the pistons of power cylinders 232, thus lowering or raising door 222.

While the vacuum pump, gas source and radio frequency power source are shown only in FIGS. 1 and 6, it is to be understood that they are part of each of the systems shown in FIGS. 3 through 5 and 8 through 13.

It is assumed in FIGS. 9 through 13 that control means 17 has been suitably programmed and configured by manipulating the manual controls on the front panel of process control module 214, that the proper gas source or sources 230 (FIG. 6) has been selected for the processing of workpieces 300 to bring about the desired plasma treatment of workpieces 300, and that workpieces 300 have been manually or robotically disposed on shelf 236'.

As a result of thus configuring and arranging plasma treatment apparatus 210, and the operator having manually depressed pushbutton 215, it is further assumed in FIGS. 9 through 13 that door 222 is fully closed, and that thus reaction chamber 216 is sealed from ambient air; that vacuum pump 228 has pumped reaction chamber 216 down to a suitable vacuum level, between 50 and 80 mTORR; that a suitable processing gas or mixture of processing gasses has been admitted to reaction chamber 216; and further that the flow of said processing gas or gasses into reaction chamber 216 is so controlled by control means 17 and its associated pressure measuring device as to maintain a predetermined processing gas pressure level in reaction chamber 216; and that external radio frequency source 280 has been energized under the control of control means 217 to apply radio frequency energy to the processing gas in reaction chamber 216.

Going, then, to FIG. 9, it will be seen that contact plate 330' has been pushed forward (leftward) on the end of pushrod 312 of horizontal drive system 310, and thus has pushed the uppermost three of the workpieces 300 in magazine 292 across processing gap 340 and into corresponding groove pairs in magazine 294, all under the control of control means 217.

As explained hereinabove in connection with the disclosure of the first preferred embodiment of the present invention, the rate of translation of workpieces across the processing gap between the two magazines is controlled by control means 217, and is determined empirically, as part of the configuration and arrangement of plasma treatment apparatus 210 to process workpieces of a particular kind in a desired manner.

Figures 10, 11:
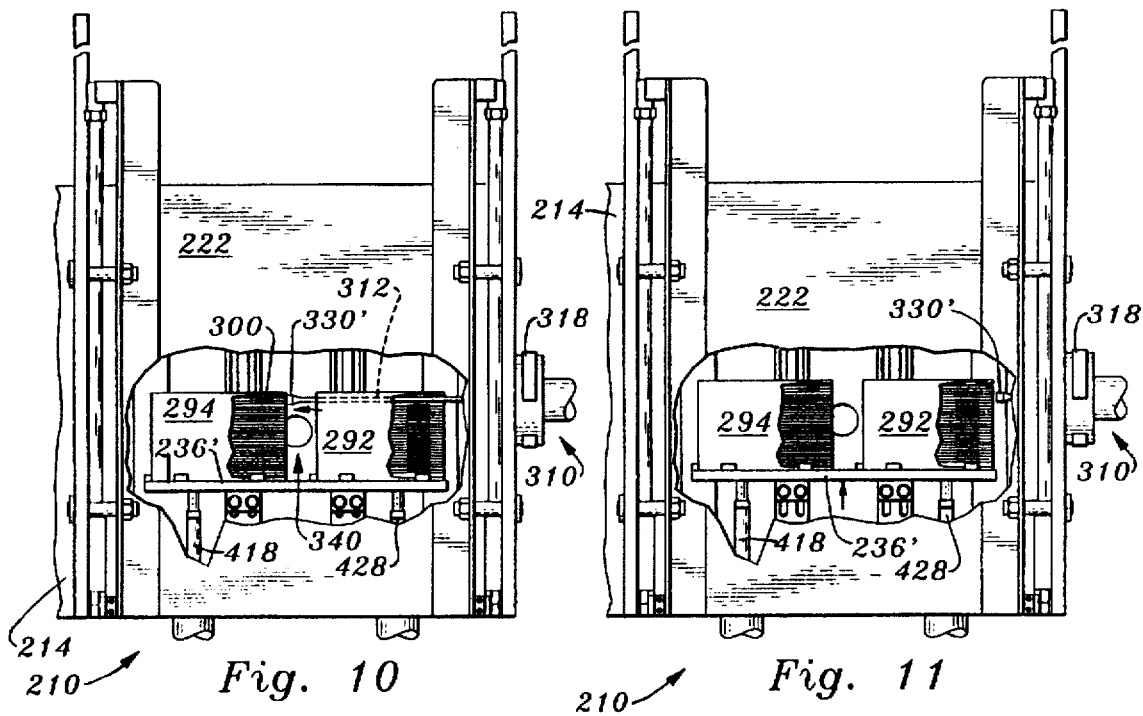
FIGS. 10, 11, 12 and 13 show the plasma treatment apparatus of the second preferred embodiment of the present invention at several stages of its operating cycle.

Referring now to FIG. 10, it will be seen that pushrod 312 has completed its forward (leftward) stroke, and that thus contact plate 330' has pushed the uppermost three workpieces 300 to their position of rest wherein they are completely received in magazine 294.

Referring now to FIG. 11, it will be seen that, by the full retraction of pushrod 312, contact plate 330' has been completely withdrawn to its "home" position, i.e., the same position shown in FIG. 8, and that shelf 236' has been raised until the top three workpieces remaining in magazine 292 confront contact plate 330', all under the control of control means 217 in process control module 214.

Figures 12, 13:
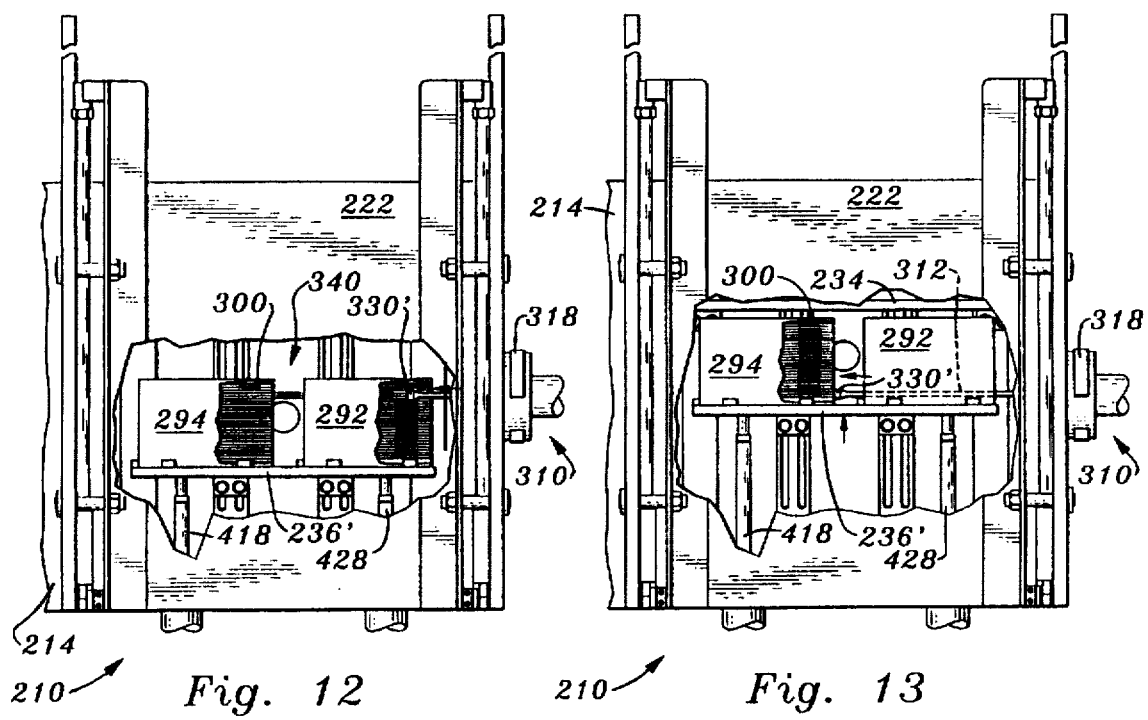

Referring now to FIG. 12, it will be seen that horizontal drive system 310 has advanced pushrod 312, and contact plate 330', sufficiently to push the second set of three workpieces in magazine 292 across processing gap 340 and into the corresponding groove pairs in magazine 294.

Referring now to FIG. 13, it will be seen that, after a series of incremental raisings of shelf 236' and corresponding full leftward strokes of pushrod 312, all under the control of control means 217, all of the workpieces 300 which were in magazine 292 have been transferred into magazine 294 across processing gap 340.

After the withdrawal of pushrod 312 so that contact plate 330' returns to its "home" position all of the workpieces 300 in magazine 294 will have been treated by the plasma maintained in the spaced between shelves 234 and 236.

As will now be understood by those having ordinary skill in the art, informed by the present disclosure, control means 217 now acts to: (1) terminate the excitation of radio frequency energy source 280, (2) stop the flow of processing gas or gasses into reaction chamber 216, (3) bleed reaction chamber 216 to ambient atmosphere, and (4) lift door 222.

Magazine 294, containing completely treated workpieces 300, and empty magazine 292 may then be manually or robotically removed from reaction chamber 216.

The Third Preferred Embodiment

Referring now to FIGS. 15 through 24, there is shown a magazine-fed, batch-processing plasma treatment apparatus 510 of the third preferred embodiment of the present invention.

Many parts and subsystems of plasma treatment apparatus 510 are substantially identical to the corresponding parts and subsystems of the PX Series Plasma Cleaning Systems made and sold by March instruments, Inc., of Concord, Calif., U.S.A. All such corresponding parts and subsystems will be described only generally, and will sometimes hereinafter be identified by the suffix "PX-".

Figure 15:
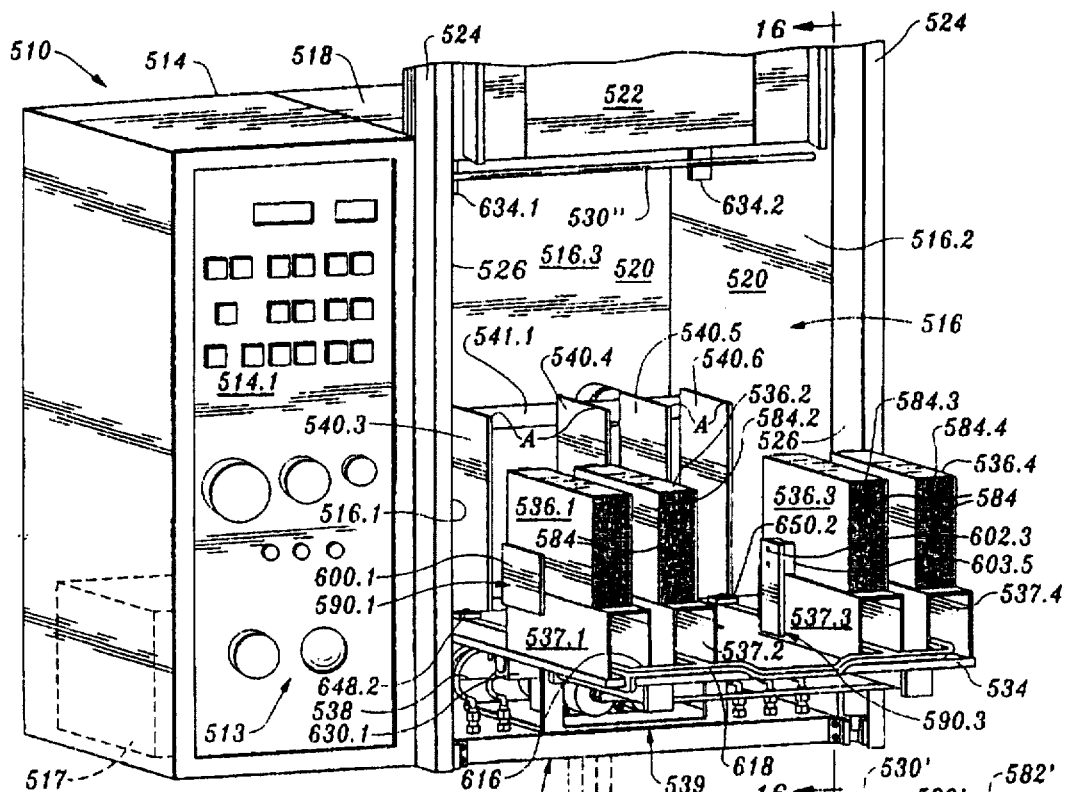
FIG. 15 is a perspective view of a magazine-fed, batch-processing plasma treatment apparatus of the third preferred embodiment of the present invention.

Referring now to FIG. 15, it will be seen that plasma treatment apparatus 510 is comprised of two principal components, viz., reaction chamber assembly 512 and process control module 514, on the front panel of which are a plurality of manually operable and human-readable controls 513.

In keeping with the ordinary usage of the plasma treatment art, both reaction chamber assembly 512 and the reaction chamber 516 defined thereby may sometimes be designated by the term "reaction chamber" hereinafter.

Reaction chamber assembly 512 is comprised of an outer shell or housing 518 which contains a reaction chamber shell 520 which is fixedly positioned within housing 518 by suitable positioning means.

Figure 16:
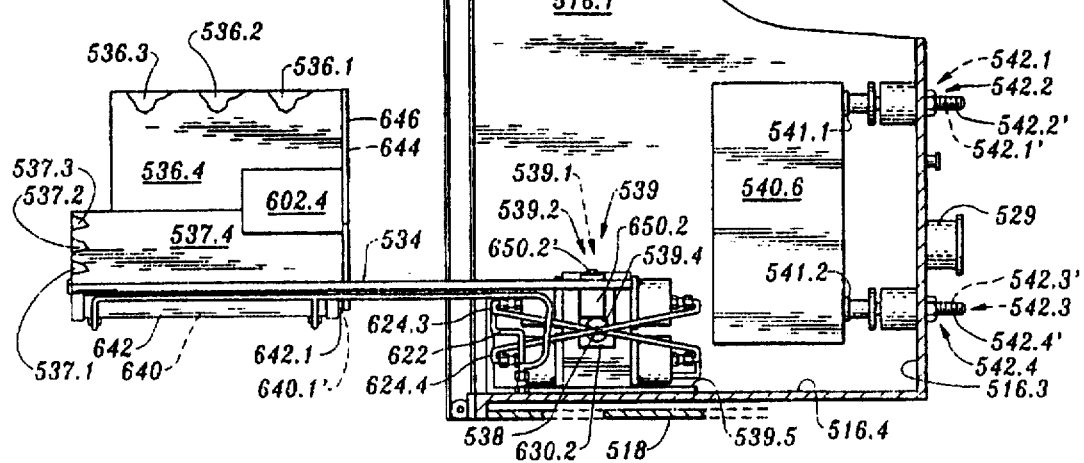
FIG. 16 is a sectional side elevational view of the plasma treatment apparatus of the third preferred embodiment of the present invention, with its door open, showing the processing shelf in the horizontal loading position.

For clarity of illustration, outer shell 518 is shown in part only in some of the drawings, e.g., FIG. 16, and is not shown at all in other drawings.

Reaction chamber assembly 512 is further comprised of a door 522 and door track means 524, 524' upon which door 522 is slidably mounted for vertical sliding movement between its "open" position (shown in FIG. 15) and its downwardmost (or "closed") position in which it is pressed against a gasket affixed to door frame 526, and thus is vacuum-tightly sealed to door frame 526, whereby the interior of reaction chamber 516 is completely isolated from the ambient atmosphere surrounding plasma treatment apparatus 510.

Thus, when door 522 is completely closed and sealed to doorframe 526, reaction chamber 516 can be evacuated by means of an external vacuum pump 528, through a vacuum hose 528', a pneumatic valve 529' (FIG. 19), and a port 529 (FIG. 19) in the back wall of reaction chamber 516. Vacuum pump 528 may be an ALCATEL Model No. UT2063CP, Chemical Series, Two-Stage, Rotary Vane Pump. Solenoid valve 529' (FIG. 19) is controlled by programmable control means 517, which is contained in and forms a part of process control module 514 (FIG. 15).

Plasma treatment apparatus 510 is also comprised of a gas source 530 from which a suitable processing gas or combination of gasses may be injected into reaction chamber 516 via perforated gas injection manifold (530", FIG. 15), under the control of control means 517, which constitute a part of process control module 514.

As exemplified in said PX Series Plasma Cleaning Systems, plasma treatment apparatus 510 (FIG. 15) is further comprised of a pair of power cylinders which are adapted to operate door 522 between its open position (shown in FIG. 15) and its fully closed position, under control of control means 517 (FIG. 15).

Suitable pneumatic power cylinders may be commercially purchased under the trade designation BIMBA Part No. CF-0921-DXP, 1 1/16 inch bore, double-acting air cylinders with adjustable front head cushion. The operation of these power cylinders, and thus the positioning of door 522, is controlled by control means 517.

Referring again to FIG. 15, it will be seen that reaction chamber 516 contains a processing shelf 534 which is capable of supporting four lead frame magazines or workpiece magazines 536.1, 536.2, 536.3, 536.4, which are loaded with lead frames or other workpieces in the well known manner.

As also seen in FIG. 15, each workpiece magazine 536 (the reference numeral 536 being taken herein to denote all of the workpiece magazines 536.1, 536.2, 536.3, 536.4, or any one or ones of them) is disposed upon a magazine stand 537, the structure and function of which will be explained in detail hereinafter.

It is to be understood at this point in the present specification, however, that each magazine stand 537 is affixed to processing shelf 534 at the respective location indicated in FIG. 15.

Processing shelf 534 may be fabricated from rigid, highly conductive material, such as ¼ inch (minimum) thickness aluminum plate.

Further, as may best be seen by comparison of FIGS. 16 and 18, processing shelf 534 is selectively positionable in at least two positions subtended about axis 538 (FIGS. 16 and 18) by process shelf tilting means 539, the structure and operation of which will be described hereinafter.

Figure 24:
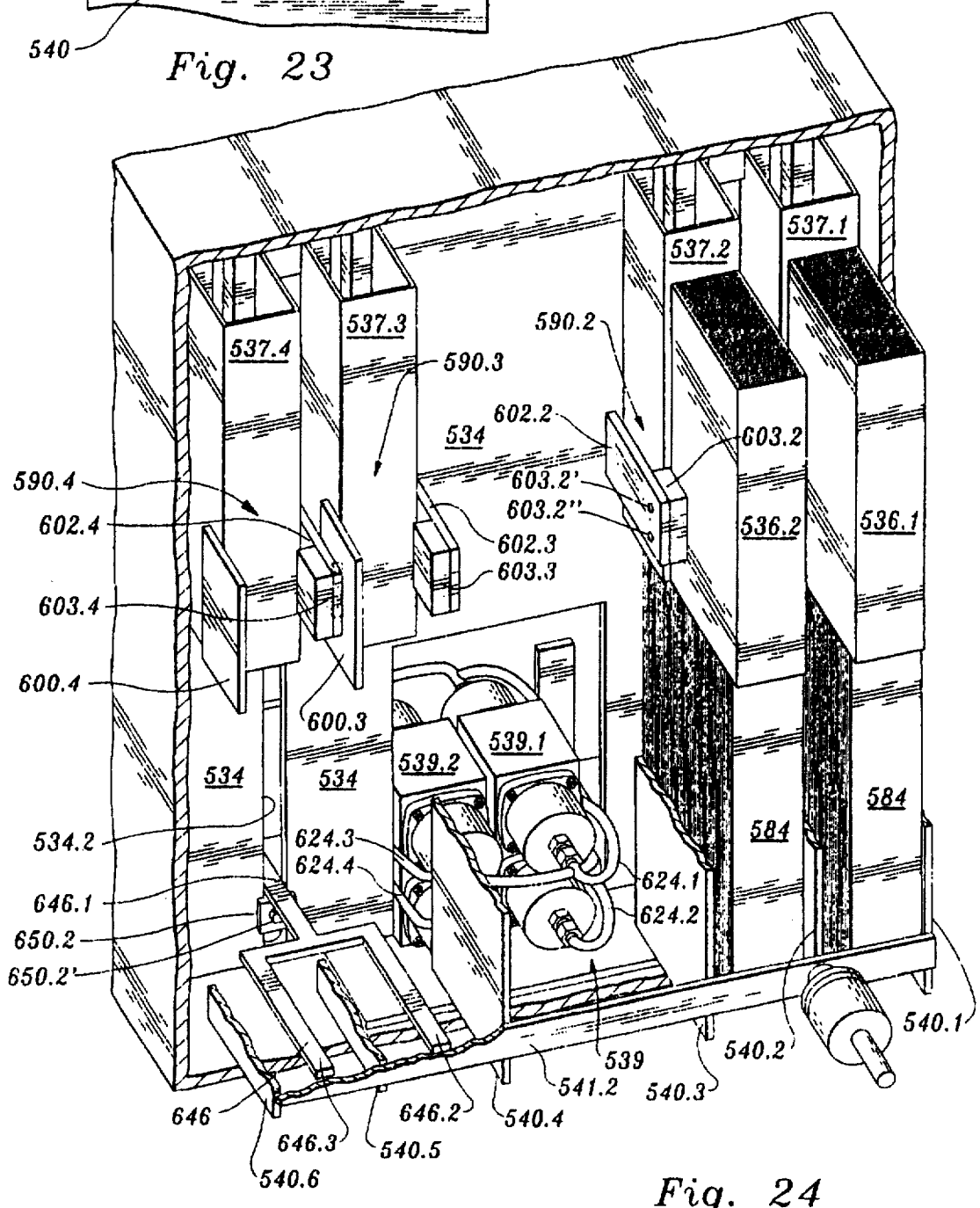
FIG. 24 is a sectional perspective view of the plasma treatment apparatus of the third preferred embodiment of the present invention, showing the leadframes in the plasma treating position.

Referring to FIGS. 15, 16 and 24, and comparing the same, it will be seen that six vertically disposed, planar ionizing electrodes 540.1, 540.2, 540.3, 540.4, 540.5 and 540.6 are mounted on the rear wall 516.3 of reaction chamber 516. All of these electrodes are parallel to each other, and parallel to the side walls 516.1, 516.2 of chamber 516.

Further, all six of the electrodes of electrode array 540 (i.e., ionizing electrodes 540.1, 540.2, 540.3, 540.4, 540.5 and 540.6) are mounted in reaction chamber 516 in mutually fully confronting relationship, such that the upper, forward corners, A, of all six electrodes lie on the same straight line, which line is perpendicular to both sidewalls 516.1, 516.2 of reaction chamber 516.

Similarly, the lower, back corners B of all six electrodes of the electrode array 540 lie on the same straight line, which line is perpendicular to the sidewalls 516.1, 516.2 of reaction chamber 516.

The other two corners C, D of each of the 540 array electrodes, respectively, lie on two straight lines, i.e., the C-line and the D-line, both of which lines are perpendicular to the sidewalls 516.1, 516.2 of reaction chamber 516.

As best seen by comparison of FIGS. 15, 16 and 24, the electrodes of electrode array 540, i.e., electrodes 540.1, 540.2, 540.3, 540.4, 540.5, and 540.6, are mounted on a pair of buss bars 541.1, 541.2.

As best seen in FIG. 16, buss bars 541.1 and 541.2 are parallel to the rear wall 516.3 of reaction chamber 516, and are also parallel to the floor 516.4 of reaction chamber 516.

As also seen in FIG. 16, the two busses 541.1, 541.2 are located at substantially the same distance from rear wall 516.3.

Upper buss 541.1 is mounted on a pair of feed-through insulators 542.1, 542.2 (FIG. 16), and lower buss 541.2 is mounted on a pair of feed-through insulators 542.3, 542.4 (FIG. 16).

A suitable vacuum-tight feed-through insulator (542.2) for this application is illustrated in FIG. 16, and is widely available under the commercial designation Douglass Engineering Part No. SS-VAC-2 Studseal Feedthru.

It is further to be understood by those having ordinary skill in the art, informed by the present disclosure, that neither buss 541.1, 541.2 is directly electrically connected to all of the electrodes of electrode array 540.

To the contrary, each of the 540 array electrodes is electrically connected to one of the busses 541.1, 541.2, but not to the other.

More particularly, ionizing electrodes 540.1, 540.3, 540.4 and 540.6 are directly electrically connected to and mechanically supported by upper buss 541.1; and ionizing electrodes 540.2 and 540.5 are mechanically supported and directly electrically connected to lower buss 541.2.

Conversely, electrodes 540.1, 540.3, 540.4 and 540.6 are mechanically supported by but not electrically connected to upper buss 541.1, and electrodes 540.2 and 540.5 are electrically connected to and mechanically supported by upper buss 541.1.

The inner ends of feed-through conductors 542.1 and 542.2 are electrically connected to buss 541.1; and the inner ends of feed-through conductors 542.3' and 542.4' are electrically connected to buss 541.2.

The outer ends of feed-through conductors 542.1', 542.2', 542.3' and 542.4' are electrically interconnected by means of rigid conducting means, and radio frequency coupler means are connected to said conducting means.

Said radio frequency coupler means are coupled to suitable external solid state radio frequency power generating means 580 (FIG. 15) via suitable cables 580' (FIG. 15).

The ground connection of said radio frequency coupler means is directly conductively connected to the walls of reaction chamber assembly 512, which are conductive and electrically interconnected.

As will now be apparent to those having ordinary skill in the art, informed by the present disclosure, a radio frequency field is established between the 540 array electrodes and the walls of reaction chamber 516 whenever said external solid state radio frequency generator 580, (FIG. 15) is energized under the control of control means 517 (FIG. 15), and thus a non-directional "bulk" plasma is created around the 540 array electrodes. The 540 array electrodes are close enough to each other, and to leadframes 584 so that this plasma bathes the entire surface of each leadframe.

It is further to be understood that control means 517 of the type found in processing control module 514 are such that the provision of the same would be well within the scope of one having ordinary skill in the art, familiar with the plasma cleaning systems of the present invention.

As will be understood by those having ordinary skill in the plasma treatment art, workpiece magazines 536 are workpiece magazines of a type widely used in the integrated circuit making art. As is also well known, many different types of workpiece magazines are found in use in the integrated circuit making art, and workpiece magazines 536 are of but one such type.

It is to be understood that workpiece magazines 536 are identical to workpiece magazine 92, which is shown in FIG. 2 and described in detail in the present specification in connection with FIG. 2.

It is also to be understood that the interior height of chamber 516 is greater than the interior height of chamber 16 of the first preferred embodiment (FIG. 1).

In accordance with a principal feature of the present invention, plasma treatment apparatus 510 is adapted for use in connection with many of said different types of workpiece magazines by making simple mechanical adjustments of apparatus 510, and without making any structural modifications of any part or parts of apparatus 510.

As seen in FIGS. 15, 17, 18, 19, 20, 21, 22, 23 and 24, each workpiece magazine 536 is loaded with leadframes 584, and each leadframe is either completely contained in its associated workpiece magazine 536 or at least partially contained in its associated workpiece magazine 536.

It is to be understood that leadframes 584 are typical leadframes of the type well known in the integrated circuit art, and are not themselves part of the present invention.

It is also to be noted that, in accordance with a principal feature of the present invention, none of the leadframes 584 ever completely leaves its associated pair of the leadframe retaining slots of its associated workpiece magazine during the entire processing of that leadframe by apparatus 510 of the present invention.

Referring again to FIG. 15, it will be seen that each one of the four magazines 536 shown in FIG. 15 is disposed upon a corresponding magazine stand 537 (the reference numeral 537 being taken herein to denote all of the magazines 537.1, 537.2, 537.3, 537.4, or any one or ones of them). Thus, it is to be understood that each magazine 536 shown in FIG. 15 is disposed upon a corresponding magazine stand 537.

By "corresponding" is meant that the particular reference numeral designating the magazine under discussion has the same decimal part as the reference numeral denoting the associated magazine stand. Thus, e.g., magazine 536.1 is disposed upon corresponding magazine stand 537.1, etc.

Further, it is to be understood that the set of leadframes 584 received in any particular magazine 536 may sometimes be identified herein by the number 584 followed by the decimal part of the reference numeral designating that particular magazine.

Thus, it will be understood by those having ordinary skill in the art, informed by the present disclosure, that, e.g., magazine 536.2 is disposed upon magazine stand 537.2, and contains a set of leadframes which are collectively denoted by the reference numeral 584.2.

It is further to be understood that each magazine stand is immovably affixed to the upper surface of processing shelf 534, at the particular location indicated in FIG. 15.

Figure 17:
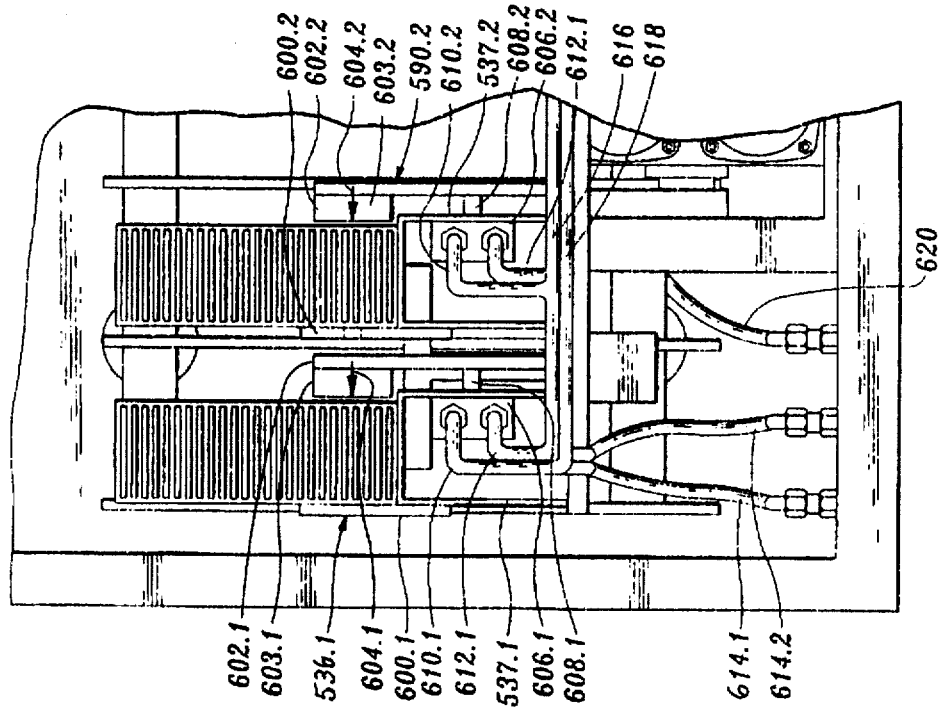
FIG. 17 is a partial front elevational view of the plasma treatment apparatus of the third preferred embodiment of the present invention, showing in closeup the magazine stands and elements associated therewith.

As may be seen by comparison of FIGS. 15, 17 and 24, each magazine stand 537 is provided with a magazine clamp 590 corresponding thereto, the decimal part of any magazine stand reference numeral being the same as the decimal part of the reference numeral applied to its associated magazine clamp. Each magazine clamp 590 is comprised of a fixed magazine clamping jaw 600, which is affixed to one side thereof, as by welding or by suitable machine screws (the reference numeral 600 being taken herein to denote all of the fixed clamping jaws affixed respectively to magazine stands 537, or any one or ones of them).

The clamping jaws 600, 603 are knurled to facilitate sufficient gripping of the magazines gripped therein.

Referring again to FIGS. 15, 17 and 24, there are shown moveable magazine clamping jaws 602.1, 602.2, 602.3 and 602.4 of magazine clamps 590 (the reference numeral 602 being taken herein to denote all of the moveable magazine clamping jaws, or any one or ones of them).

Each moveable jaw 602 of a magazine clamp 590 is transversely moveable as indicated by the arrows 604.1, 604.2 shown in FIG. 17.

As also seen in FIG. 17, each moveable jaw 602.1, 602.2 is provided with a pad 603.1, 603.2. In general, then, each moveable jaw 602 is provided with a pad 603, and each pad 603 is affixed to its associated moveable jaw 602 by means of a pair of screws, e.g., 603.2' and 603.2" (FIG. 24).

In accordance with a principal feature of the present invention, then, apparatus 510 can be adjusted to accommodate new magazines of different widths from magazines 536 by removing pads 603 and replacing them with new pads which are all of the same thickness, but are of different thickness from the thickness from pads 603, said new pads being suitable for tightly grasping the new magazines between fixed jaws 600 and the new pads mounted on movable jaws 602.

As further seen in FIG. 17, each magazine stand 537 contains an air solenoid 606.1, 606.2, 606.3, 606.4 (the reference numeral 606 being taken herein to denote all of the air solenoids contained in magazine stands 537, or any one or ones of them).

As yet further seen in FIG. 17, each air solenoid 608 includes a piston rod 608.1, 608.2, etc., which is moved longitudinally when its associated air cylinder is energized via the associated air supply tubes 610.1, 612.1, 610.2, 612.2, etc., which are provided with air under pressure from air pressure source 582 (FIG. 15) via intermediate tubes 582' (FIG. 15), 614.1, 614.2, 616, 618 (FIG. 17), etc., the presence or absence of pressurized air in the cylinders of air solenoids 606 being determined by a control valve which is actuated by programmable control means 517 (FIG. 15).

Thus it will be seen by those having ordinary skill in the art, informed by the present disclosure, that all of the movable jaws 602 are simultaneously moved either to their clamping positions or to their non-clamping positions (FIG. 17), whereby to clamp or unclamp magazines 536 (FIG. 15).

It will further be seen that the function of magazine clamps 590 is to selectively clamp magazines 536 to their associated magazine stands 537, and thus to clamp magazines 536 to processing shelf 534 (FIG. 15).

Figure 18:
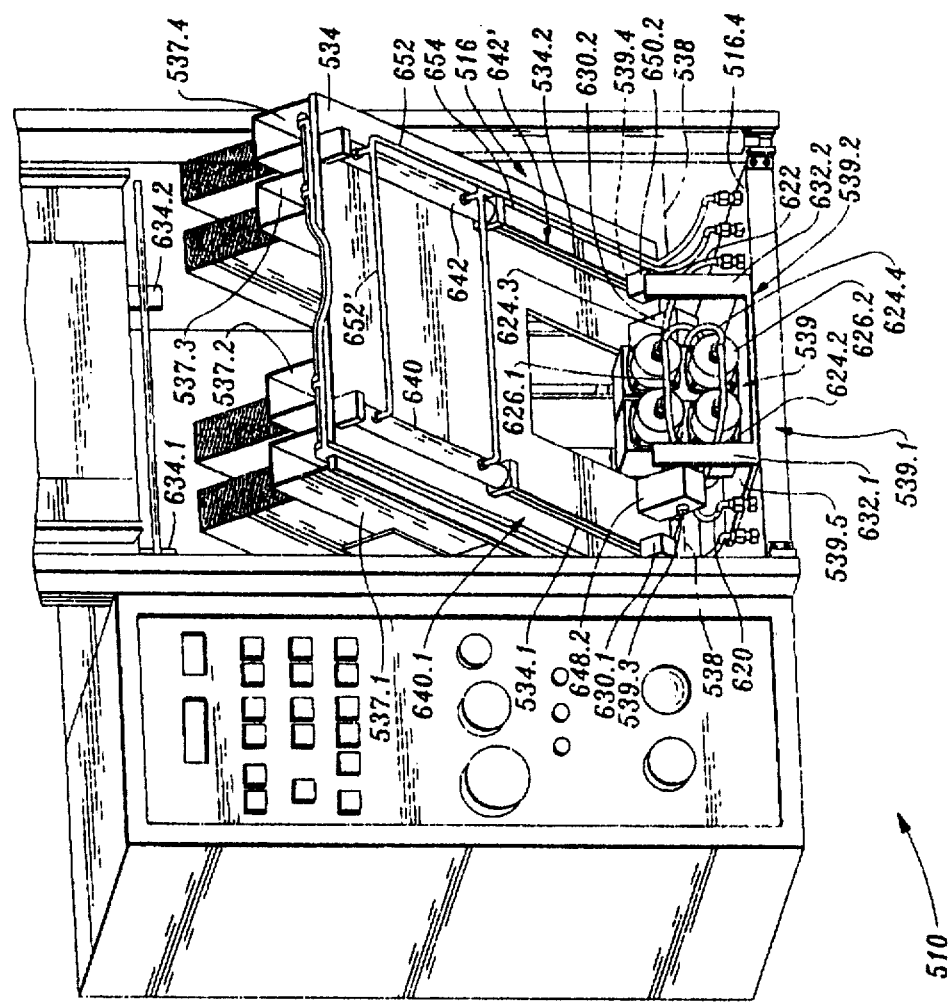
FIG. 18 is perspective view of the plasma treatment apparatus of the third preferred embodiment of the present invention, with the processing shelf in a tilted position and revealing the tilting means.

Referring now to FIG. 18, there is shown processing shelf tilting means 539. Tilting means 539 is comprised of two rotary air actuators 539.1, 539.2, each of which has an air power rotatable output shaft 539.3, 539.4 (FIG. 16).

As seen in FIG. 18, both rotary air actuators 539.1, 539.2 are affixed to a plate 539.5, and plate 539.5 is immovably affixed to the floor 516.4 of reaction chamber 516.

As also seen in FIG. 18, rotary air actuators 539.1, 539.2 are affixed to plate 539.5 in closely juxtaposed side-by-side relation, so that the axes of rotation of output shaft 539.3, 539.4 are coincident with common axis 538.

As may be seen by comparison of FIGS. 16, 17 and 18, rotary actuators 539.1, 539.2 are jointly supplied with compressed air via tubes 620, 622 and interconnecting tubes 624.1, 624.2, 624.3, 624.4, 626.1, 626.2, etc. (The reference numerals 624 and 626 being used herein to denote all of the interconnecting tubes interconnecting rotary actuators 539.1, 539.2 with tubes 620, 622, or any one or ones of them).

It is to be understood that interconnecting tubes 624, 626 are so connected and arranged that pressurized supply air received via tubes 620, 622 causes output shafts 539.3, 539.4 to at all times execute the same operations, i.e., to rotate forward (counterclockwise as seen in FIG. 16), to rotate backward, and to remain at standstill, in complete synchronism.

It is further to be understood that air supply tubes 620, 622 are coupled to compressed air supply 582 (FIG. 15) via a pair of tubes represented by dashed line 582' in FIG. 15, and via valve means which is controlled by programmable control means 517 (FIG. 15), and that thus the operation of rotary actuators 539.1, 539.2 is determined by control means 517.

Referring now to FIG. 18, it will be seen that a pivot block 630.1 is mounted on and affixed to output shaft 539.3, and that a pivot block 630.2 is mounted on and affixed to output shaft 539.4, and that thus pivot blocks 630.1 and 630.2 rotate about axis 538 whenever shafts 539.3, 539.4 rotate about their respective axes of rotation.

The upper end of each pivot block 630.1, 630.2, remote from axis 538, is affixed to processing shelf 534, and thus processing shelf 534 rotates about axis 538 whenever shafts 539.3 and 539.4 are rotated about their respective axes of rotation.

As best seen in FIG. 18, a pair of stop plates 632.1, 632.2 are erected upon the front edge of plate 539.5.

As seen in FIG. 16, stop plates 632.1, 632.2 act as stops for limiting the forward rotation of processing shelf 534, and also support processing shelf 534 when it is in its forward or horizontal position.

As may be seen by comparison of FIGS. 15 and 16, a pair of stops 634.1, 634.2 are affixed to the roof 516.5 of reaction chamber 516.

Referring to FIG. 20, it will be seen that stops 634.1, 634.2 limit the inward rotation (into reaction chamber 15) of processing shelf 534, so that processing shelf 534 cannot rotate inwardly beyond its vertical position.

Referring now to FIG. 18, it will be seen that a pair of air cylinders 640, 642 are each affixed to the face of processing shelf 534 opposite magazine stands 537. Cylinders 640, 642 will sometimes be called the "lead frame support fork positioning cylinders" herein.

Each support fork positioning cylinder 640, 642 is provided with a double piston rod 640.1, 642.1 (FIG. 16). Thus, e.g., piston rod 640.1 (FIG. 16) is comprised of two separate rods 640.11, 640.12. Piston rod 642.1 is comprised of rods 642.11, 642.12.

As may be seen by comparison of FIGS. 16, 20 and 24, apparatus 510 of the present invention includes a pair of lead frame stack support forks 644, 646.

Each support fork 644, 646 supports two columns of lead frames 584 when processing shelf 534 is vertical, as seen in FIGS. 20 and 24.

As best seen in FIG. 24, support fork 646 is comprised of a shank 646.1, and two tines 646.2, 646.3.

As also seen in FIG. 24, shank 646.1 of support fork 646 passes through a slot 534.2 in processing shelf 534.

As seen, for example, in FIG. 19, the end of fork shank 646.1 remote from tines 646.2, 646.3 is affixed to the end of the piston rod 642.1 of support fork positioning cylinder 642.

It is to be understood that a substantially identical slot 534.1 is provided to accommodate the shank 644.1 of support fork 644.

As seen in FIG. 24, a selectively positionable stop 650.2 is captive in slot 534.2, and is provided with a nut 650.2' whereby it can be fixed at any desired position along the length of slot 534.2, to limit the downward travel of fork 646.

A similar selectively positionable stop 648.2 is captive in slot 534.1 to limit the downward travel of fork 644.

Stop 648.2 is provided with a nut 648.2' to fix stop 648.2 at any desired position in slot 534.1.

Thus, it will be seen by those having ordinary skill in the plasma treatment art, informed by the present disclosure, that tine 644.2 of fork 644 supports lead frame stack 584.1 (FIG. 15), tine 644.3 of fork 644 supports lead frame stack 584.2 (FIG. 15), tine 646.2 of fork 646 (FIG. 24) supports lead frame stack 584.3 (FIG. 15), and tine 646.3 of fork 646 (FIG. 24) supports lead frame stack 584.4 (FIG. 15).

Figure 23:
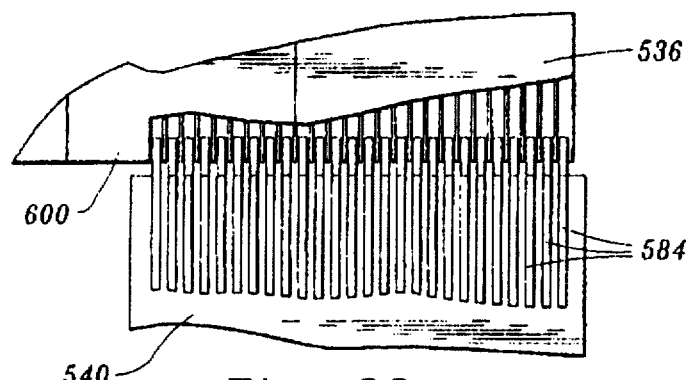
FIG. 23 is a partial elevational view of the plasma treatment apparatus of the third preferred embodiment of the present invention, showing in closeup the relation of the leadframes to their associated magazine while in the plasma treating position.

It is further to be understood, as seen in FIG. 23, that in accordance with a principal feature of the present invention stops 648.2 and 650.2 will be so located and fixed in their associated slots 534.1, 534.2 that the upper ends of the leadframes 584 of any leadframe stack are not completely disengaged from their associated slots in their associated magazine 536, and that thus each leadframe treated in a device 510 of the third preferred embodiment of the present invention is returned, at the termination of processing, to the same pair of slots from which it was temporarily withdrawn by gravity during the processing thereof.

It is further to be understood that air cylinders 640, 642 are supplied with air under pressure from air supply source 528 (FIG. 15) via tubes 528', 652, 652' (FIG. 18), 654, 654', etc., via pneumatic control valve means, which control valve means are controlled by programmable control means 517 (FIG. 15). It is to be understood, then, that the movement of support forks 644, 646 is controlled by means of programmable control means 517 (FIG. 15).

Operation

Referring now to FIGS. 16, 19, 20, 21 and 22, a full operating cycle of plasma treatment apparatus 510 of the third preferred embodiment of the present invention, as automatically executed under the control of control means 517 (FIG. 15) will now be described in detail.

Referring first to FIG. 16, it will be seen that processing shelf 534 has been manually loaded with four workpiece magazines 536, one magazine 536 being placed on each magazine stand 537. Each magazine 536 is placed on an associated magazine stand 537 between a fixed clamping jaw 600 and a movable clamping jaw 603 (FIG. 17), with its inner end, i.e., its open end directly confronting its associated support fork tine, in contact with its associated support fork tine.

Once all four magazines 536 are thus loaded on magazine stands 537, the operator using apparatus 510 depresses a designated one of the manual control means which appear on the instrument panel 514.1 of control module 514 (FIG. 15).

Under the control of control means 517, and the control program stored therein, the movable clamping jaws 603.1, 603.2, 603.3, 603.4 are moved toward their respective associated magazines 536, until all four magazines 536 are firmly clamped between their associated movable jaws 603 and their associated fixed jaws 600.

With all four magazines 536 thus clamped to their respective associated magazine stands 537, and thus to processing shelf 534, tilting means 539 (FIG. 16) is energized, and thus processing shelf 534 begins to tilt about tilt axis 538 in such manner that the outer end of processing shelf 534 rises, as seen in FIG. 19.

This tilting action continues until processing shelf 534 is vertically oriented (FIG. 20).

Reaction chamber door 522 is then power-driven downwardly to its fully closed position (FIG. 20) by door operating means of the kind discussed hereinabove in connection with the first preferred embodiment of the present invention, said door operating means being under the control of control means 517.

When door 522 is in its downwardmost (closed) position, it is vacuum-tightly sealed to door frame 526 by means of a gasket which is itself air-tightly secured in a groove in door frame 526.

Upon the full closing of door 522 control means 517 initiates the extraction of air from reaction chamber 516 by vacuum pump 528, and, subsequently, the injection of process gas into reaction chamber 516 from gas source 530 (FIG. 15).

Figure 22:
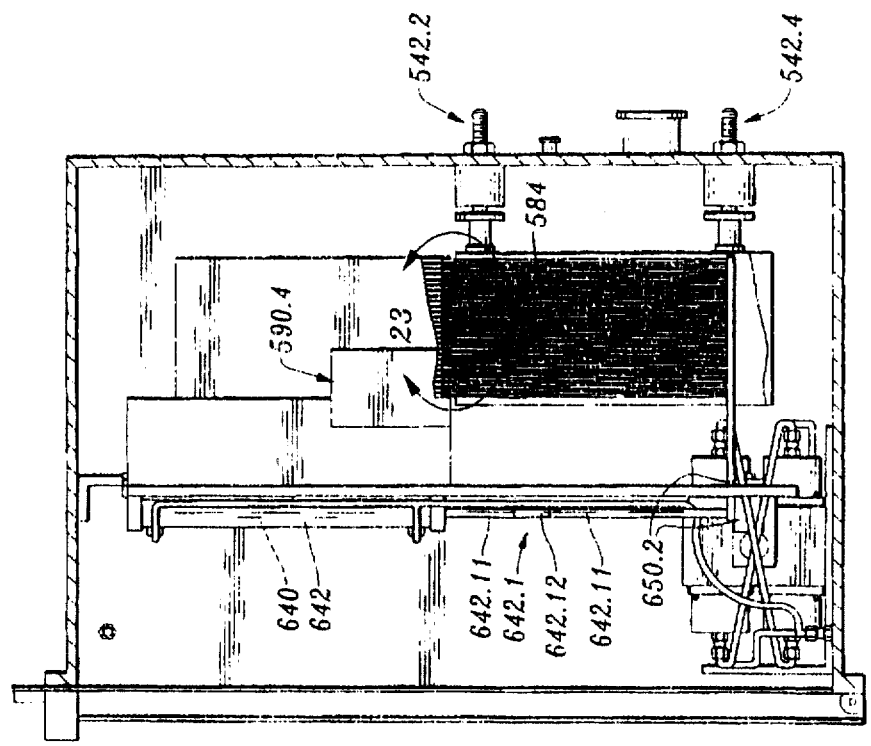
FIG. 22 is a sectional side elevational view of the plasma treatment apparatus of the third preferred embodiment of the present invention, showing the leadframes in their plasma treating lowest position.
Figure 21:
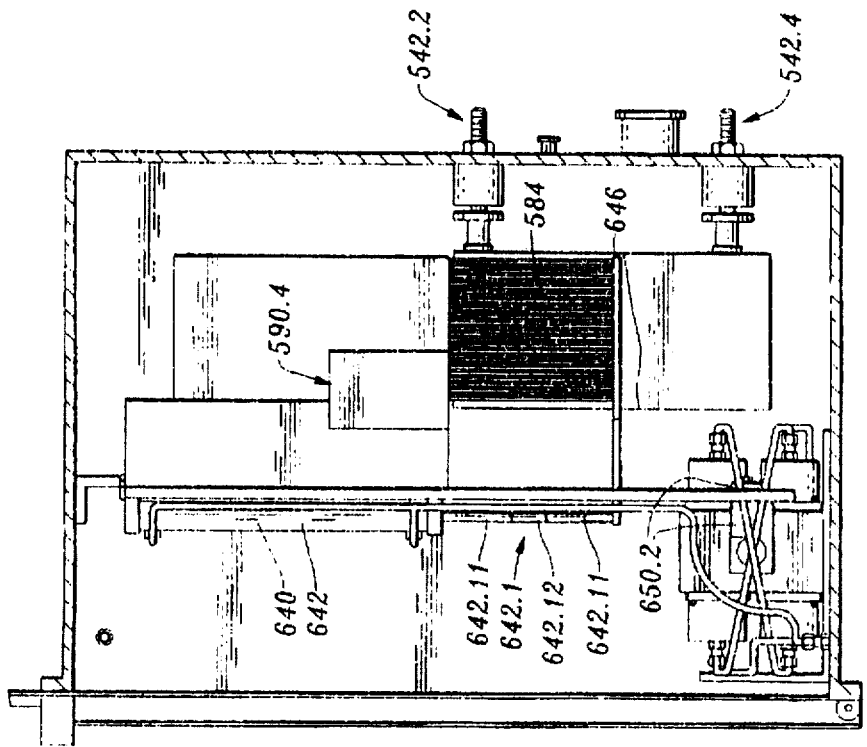
FIG. 21 is a sectional side elevational view of the plasma treatment apparatus of the third preferred embodiment of the present invention, with its door closed and the leadframes having been caused to partially drop out of their associated magazine stands.

During the evacuating of air from reaction chamber 516, and the subsequent injection of processing gas into reaction chamber 516, control means 517 brings about the redistribution of pressurized air in support fork positioning cylinders 640, 642, and thus causes both leadframe support forks 644, 646 to move downwardly, through the position shown in FIG. 21, and into the final position shown in FIG. 22.

It is to be understood that, in accordance with a principal feature of the present invention, the leadframes 584 are free to drop downwardly out of their associated magazines 536, and to remain in contact with the tops of their respective associated support fork tines until they each their plasma treating positions indicated in FIG. 22.

Once the proper processing atmosphere has been established in reaction chamber 516, and all of the leadframes 5366 have been lowered to their treating positions indicated in FIG. 22, control means 517 then brings about the energization of radio frequency solid state power generating means 580, and thus establishes a plasma within reaction chamber 516, surrounding all of the lead frames 584.

As seen in FIG. 23, it is a principal feature of the present invention that a small portion of the upper end of each leadframe 584 remains within its associated magazine 536, whereby no leadframe 584 escapes completely from its associated pair of grooves in its associated magazine 536 at any time during the processing thereof in apparatus 510.

Control means 517 continues the existence of said plasma in reaction chamber 516 until the expiration of a time interval during which (experience has indicated) all of the leadframes 584 will have been thoroughly treated by plasma bombardment, and then terminates the energization of solid state power generating means 580.

After the expiration of the plasma treating period, processing control means 517 initiates the flushing of processing gas from reaction chamber 516 by nitrogen gas injected into port 529, and then brings about the opening of door 522.

Along with the opening of door 522, process control means 517 brings about the retraction of piston rods 640.1, 642.1 into their respective associated air cylinders 640, 642, causing support forks 644, 646 to return to the position indicated in FIG. 20 relative to processing shelf 534.

Process control means 517 then brings about the operation of processing shelf tilting means 539 in its reverse direction, which results in the return of processing shelf 534 to its starting position shown in FIG. 16.

When apparatus 510 has returned to its initial state, shown in FIG. 15, process control means 517 also brings about the releasing of clamps 590, and magazines 536 may be manually removed from processing shelf 534, with each leadframe 584 contained therein having been fully plasma treated, and each leadframe being in the same position in its associated magazine 536 which it occupied before the commencement of the plasma treating cycle of the third preferred embodiment of the present invention.

It will thus be seen that the objects set forth above, among those made apparent from the preceding description, are efficiently attained, and since certain changes may be made in the above constructions and the methods carried out thereby without departing from the scope of the present invention, it is intended that all matter contained in the above description or shown in the accompanying drawings shall be interpreted as illustrative only, and not in a limiting sense.

It is to be understood that the present invention is not limited to plasma treatment systems in which all of the workpieces are moved from magazine to magazine at one time, or three workpieces are moved at one time, but rather embraces systems in which one or any plurality of workpieces are moved from magazine to magazine at one time.

It is also to be understood that treatment systems of the present invention may be provided with more than two shelves, with multiple horizontal drive systems, and/or with more than one workpiece magazine pair.

It is also to be understood that the following claims are intended to cover all of the generic and specific features of the invention herein described, and all statements of the scope of the invention which, as a matter of language, might be said to fall therebetween.

What is claimed is:

1. Plasma treatment apparatus, comprising:

a reaction chamber;

a first workpiece magazine and a second workpiece magazine;

plasma producing means for striking and maintaining a plasma in said reaction chamber;

workpiece magazine supporting means located in said reaction chamber;

magazine position defining means associated with said magazine supporting means to aid in positioning said first and second magazines in said reaction chamber in a juxtaposed relation in which workpieces can be pushed out of said first magazine and into said second magazine across a gap between said magazines; and pushing means for pushing workpieces from said first magazine, across said gap, and into said second magazine while said plasma is maintained in said reaction chamber.

2. Plasma treatment apparatus as claimed in claim 1 in which said pushing means includes means for pushing all of the workpieces in said first magazine simultaneously out of said first magazine, across said gap, and into said second magazine.

3. Plasma treatment apparatus as claimed in claim 1 in which said pushing means includes means for pushing only a subplurality at one time of the workpieces in said first magazine out of said first magazine, across said gap, and into said second magazine.

4. The method of treating a plurality of workpieces with plasma, comprising the steps of:

juxtaposing a first and a second workpiece magazine in a reaction chamber, said first magazine containing a plurality of workpieces;

striking and maintaining a plasma in said reaction chamber; and pushing workpieces from said first magazine, across a gap between said magazines, and into said second magazine while said plasma exists in said gap.

5. The method of treating a plurality of workpieces with plasma as claimed in claim 4 in which all of said workpieces are simultaneously pushed from said first magazine, across said gap, and into said second magazine.

6. The method of treating a plurality of workpieces with plasma as claimed in claim 4 in which only a subplurality at a time of the workpieces in said first magazine are pushed out of said first magazine, across said gap, and into said second magazine.

7. Plasma treatment apparatus, comprising:

a reaction chamber;

workpiece magazine;

plasma producing means for producing a plasma in said reaction chamber;

workpiece magazine positioning means for alternatively positioning said workpiece magazine in a first position in which workpieces deposited therein remain at rest therein and a second position in which workpieces deposited therein drop therefrom; and workpiece maintaining means for maintaining said workpieces at least partially within said workpiece magazine when said workpiece magazine is said second position;

said second position being located in said reaction chamber in close proximity to said plasma producing means.

8. Plasma treatment apparatus as claimed in claim 7 in which said workpiece maintaining means permits substantially all but not all of each of said workpiece to emerge from said workpiece magazine.

* * * * *